United States Patent
Manning et al.

(10) Patent No.: US 7,271,051 B2
(45) Date of Patent: Sep. 18, 2007

(54) METHODS OF FORMING A PLURALITY OF CAPACITOR DEVICES

(75) Inventors: H. Montgomery Manning, Eagle, ID (US); Thomas M. Graettinger, Boise, ID (US); Marsela Pontoh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 57 days.

(21) Appl. No.: 11/272,232

(22) Filed: Nov. 10, 2005

(65) Prior Publication Data

US 2006/0063344 A1   Mar. 23, 2006

Related U.S. Application Data

(60) Division of application No. 10/733,181, filed on Dec. 10, 2003, now Pat. No. 7,125,781, which is a continuation-in-part of application No. 10/656,732, filed on Sep. 4, 2003, now Pat. No. 7,067,385.

(51) Int. Cl.
*H01L 21/8234* (2006.01)

(52) U.S. Cl. ............ 438/238; 438/239; 438/329; 438/366; 438/393; 438/396; 257/E21.013

(58) Field of Classification Search ............ None
See application file for complete search history.

(56) References Cited

U.S. PATENT DOCUMENTS

| | | |
|---|---|---|
| 5,236,860 A | 8/1993 | Fazan et al. |
| 5,340,763 A | 8/1994 | Dennison |
| 5,401,681 A | 3/1995 | Dennison et al. |
| 5,498,562 A | 3/1996 | Dennison et al. |
| 5,604,696 A | 2/1997 | Takaishi |
| 5,605,857 A | 2/1997 | Jost et al. |
| 5,652,164 A | 7/1997 | Dennison et al. |

(Continued)

FOREIGN PATENT DOCUMENTS

DE   4447804 C2   1/2002

(Continued)

OTHER PUBLICATIONS

Banhart, *Aluminum Foams: On the Road to Real Applications*, Mrs Bulletin, pp. 290-298 (Apr. 2003).

(Continued)

*Primary Examiner*—Michael Lebentritt
*Assistant Examiner*—Kyoung Lee

(57) ABSTRACT

The invention includes semiconductor constructions, and also includes methods of forming pluralities of capacitor devices. An exemplary method of the invention includes forming conductive storage node material within openings in an insulative material to form conductive containers. A retaining structure lattice is formed in physical contact with at least some of the containers, and subsequently the insulative material is removed to expose outer surfaces of the containers. The retaining structure can alleviate toppling or other loss of structural integrity of the container structures. The electrically conductive containers correspond to first capacitor electrodes. After the outer sidewalls of the containers are exposed, dielectric material is formed within the containers and along the exposed outer sidewalls. Subsequently, a second capacitor electrode is formed over the dielectric material. The first and second capacitor electrodes, together with the dielectric material, form a plurality of capacitor devices.

15 Claims, 21 Drawing Sheets

U.S. PATENT DOCUMENTS

| | | | |
|---|---|---|---|
| 5,654,222 A | 8/1997 | Sandhu et al. | |
| 5,686,747 A | 11/1997 | Jost et al. | |
| 5,702,990 A | 12/1997 | Jost et al. | |
| 5,705,838 A | 1/1998 | Jost et al. | |
| 5,767,561 A | 6/1998 | Frei et al. | |
| 5,821,140 A | 10/1998 | Jost et al. | |
| 5,900,660 A | 5/1999 | Jost et al. | |
| 5,955,758 A | 9/1999 | Sandhu et al. | |
| 5,981,350 A | 11/1999 | Geusic et al. | |
| 5,990,021 A | 11/1999 | Prall et al. | |
| 6,037,218 A | 3/2000 | Dennison et al. | |
| 6,110,774 A | 8/2000 | Jost et al. | |
| 6,133,620 A | 10/2000 | Uochi | |
| 6,180,450 B1 | 1/2001 | Dennison | |
| 6,204,143 B1 | 3/2001 | Roberts et al. | |
| 6,204,178 B1 | 3/2001 | Marsh | |
| 6,258,650 B1 | 7/2001 | Sunouchi | 438/238 |
| 6,303,956 B1 | 10/2001 | Sandhu et al. | |
| 6,323,528 B1 | 11/2001 | Yamazaki et al. | |
| 6,331,461 B1 | 12/2001 | Juengling | 438/253 |
| 6,383,861 B1 | 5/2002 | Gonzalez et al. | |
| 6,403,442 B1 | 6/2002 | Reinberg | |
| 6,432,472 B1 | 8/2002 | Farrell et al. | |
| 6,458,925 B1 | 10/2002 | Fasano | |
| 6,459,138 B2 | 10/2002 | Reinberg | |
| 6,617,222 B1 | 9/2003 | Coursey | 438/398 |
| 6,667,502 B1 | 12/2003 | Agarwal et al. | |
| 6,673,693 B2 | 1/2004 | Kirchhoff | |
| 6,709,978 B2 | 3/2004 | Geusic et al. | |
| 6,720,232 B1 | 4/2004 | Tu et al. | 438/396 |
| 6,812,513 B2 | 11/2004 | Geusic et al. | |
| 6,844,230 B2 | 1/2005 | Reinberg | |
| 6,897,109 B2 | 5/2005 | Jin et al. | 438/253 |
| 6,927,122 B2 | 8/2005 | Geusic et al. | |
| 7,042,040 B2 | 5/2006 | Horiguchi | |
| 7,073,969 B2 | 7/2006 | Kamm | |
| 7,074,669 B2 | 7/2006 | Iijima et al. | |
| 7,081,384 B2 | 7/2006 | Birner et al. | |
| 7,084,451 B2 | 8/2006 | Forbes et al. | |
| 7,125,781 B2 | 10/2006 | Manning | |
| 7,160,788 B2 | 1/2007 | Sandhu et al. | 438/424 |
| 7,179,706 B2 | 2/2007 | Patraw et al. | |
| 7,199,005 B2 | 4/2007 | Sandhu et al. | 438/244 |
| 7,202,127 B2 | 4/2007 | Busch et al. | |
| 2001/0012223 A1 | 8/2001 | Kohyama | |
| 2001/0026974 A1 | 10/2001 | Reinberg | |
| 2002/0022339 A1 | 2/2002 | Kirchhoff | 438/409 |
| 2002/0030221 A1 | 3/2002 | Sandhu et al. | |
| 2002/0039826 A1 | 4/2002 | Reinberg | |
| 2002/0086479 A1 | 7/2002 | Reinberg | |
| 2002/0090779 A1 | 7/2002 | Jang | |
| 2002/0098554 A1 | 7/2002 | Durcan et al. | |
| 2002/0153614 A1 | 10/2002 | Ema et al. | |
| 2002/0163026 A1 | 11/2002 | Park | |
| 2003/0153146 A1 | 8/2003 | Won et al. | |
| 2003/0178684 A1 | 9/2003 | Nakamura | |
| 2003/0190782 A1 | 10/2003 | Ko et al. | |
| 2003/0227044 A1 | 12/2003 | Park | |
| 2004/0018679 A1 | 1/2004 | Yu et al. | 438/253 |
| 2004/0056295 A1 | 3/2004 | Agarwal et al. | |
| 2004/0188738 A1 | 9/2004 | Farnworth et al. | |
| 2006/0115951 A1 | 6/2006 | Mosley | |
| 2006/0186451 A1 | 8/2006 | Dusberg et al. | |

FOREIGN PATENT DOCUMENTS

| | | |
|---|---|---|
| WO | 2004/027898 | 8/2004 |
| WO | 2004/040252 | 12/2004 |
| WO | WO 2005/024936 | 3/2005 |
| WO | 06/06806 | 2/2006 |

OTHER PUBLICATIONS

Gibson et al., *Cellular Solids*, Mrs Bulletin, pp. 270-274 (Apr. 2003).

Green et al., *Cellular Ceramics: Intriguing Structures, Novel Properties, and Innovative Applications*, Mrs Bulletin, pp. 296-300 (Apr. 2003).

U.S. Appl. No. 10/894,633, filed Jul. 19, 2004, Manning.

U.S. Appl. No. 10/656,732, filed Sep. 4, 2003, Manning.

U.S. Appl. No. 10/928,931, filed Aug. 27, 2004, Busch et al.

U.S. Appl. No. 10/929,037, filed Aug. 27, 2004, Manning.

Green et al., *The Structure and Applications of Cellular Ceramics*, Web Extra, 10 pages (Apr. 2003).

Karp et al., *Scaffolds for Tissue Engineering*, Mrs Bulletin, pp. 301-306 (Apr. 2003).

Kraynik, *Foam Structure: Foam Soap Froth to Solid Foams*, Mrs Bulletin, pp. 275-276 (Apr. 2003).

Maire et al., *In Situ X-Ray Tomography Measurements of Deformation in Cellular Solids*, Mrs Bulletin, pp. 284-289 (Apr. 2003).

Oh et al., *Preparation and Pore-Characteristics Control of Nano-Porous Materials Using Organometallic Building Blocks*, 4 Carbon Science, No. 1, pp. 1-9 (Mar. 2003).

Onck, *Scale Effects in Cellular Metals*, Mrs Bulletin, pp. 279-283 (Apr. 2003).

Park et al., *Block Copolymer Lithography: Periodic Arrays of $\sim 10^{11}$ Holes in 1 Square Centimeter*, 276 Science, pp. 1401-1404 (May 30, 1997).

Tsukada et al., *Preparation and Applications of Porous Silk Fibroin Materials*, 54 Journal of Applied Polymer Science, pp. 507-514 (1994).

PCT/US2004/027898; filed Aug. 26, 2004; PCT Search Report mailed Feb. 28, 2005; 4 pp.

"Novel Robust Cell Capacitor (Leaning Exterminated Ring Type Insulator) And New Storage Node Contact (Top Spacer Contact) For 70nm DRAM Technology and Beyond", Park et al; 2004 Symposium on VLSI Digest of Technical Papers; Jul. 2004; pp. 34-35.

J.P. O'Sullivan et al., *The Morphology and Mechanism of Formation of Porous Anodic Films on Aluminum*, Proc. Roy. Soc. Lond.A, vol. 317, pp. 511-543 (1970).

S. Shingubara, *Fabrication of Nanomaterials using Porous Alumina Templates*, J. Nanoparticle Res., vol. 5, pp. 17-30 (2003).

S. Tan et al., *High Aspect Ratio Microstructures on Porous Anodic Aluminum Oxide*, IEEE, pp.267-272 (1995).

V.V. Konovalov et al., *Chemistry of Materials*, Chem. Mater., vol. 11, No. 8, pp. 1949-1951 (Aug. 1999).

J. Liang et al., *Nonlithographic Fabrication of Lateral Superlattices for Nanometric Electromagnetic-Optic . . .* IEEE J. Selected Topics In Quantum Electr., vol. 8, No. 5, pp. 998-1008 (Sep./Oct. 2002).

H. Masuda et al., *Highly ordered nanochannel-array architecture in anodic alumina*, App. Phys. Lett, vol. 71, No. 19, pp. 2770-2772 (Nov. 1997).

D. Crouse et al., *Self-Assembled Nanostructures Using Anodized Alumina Thin Films for Optoelectronic Applications*, IEEE, pp. 234-235 (1999).

A. Nadeem et al., *Fabrication of Microstructures Using Aluminum Anodization Techniques*, pp. 274-277 (pre-2004).

C.Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).

Kim, D.H. et al., *A Mechanically Enhanced Storage Node for Virtually Unlimited Height (MESH) Capacitor Aiming at Sub 70nm DRAMs*, IEEE, Jan. 2004, pp. 69-72.

U.S. Appl. No. 11/006,331, filed Dec. 6, 2004, Basceri et al.

Rana et al., U.S. Appl. No. 11/360,540, filed Feb. 23, 2006.

Raghu et al., U.S. Appl. No. 11/580,418, filed Oct. 11, 2006.

Li, X and Bohn, P.W.; "Metal-assisted chemical etching in $HF/H_2O_2$ produces porous silicon" American Institute of Physics, vol. 77, No. 16, Oct. 16, 2000.

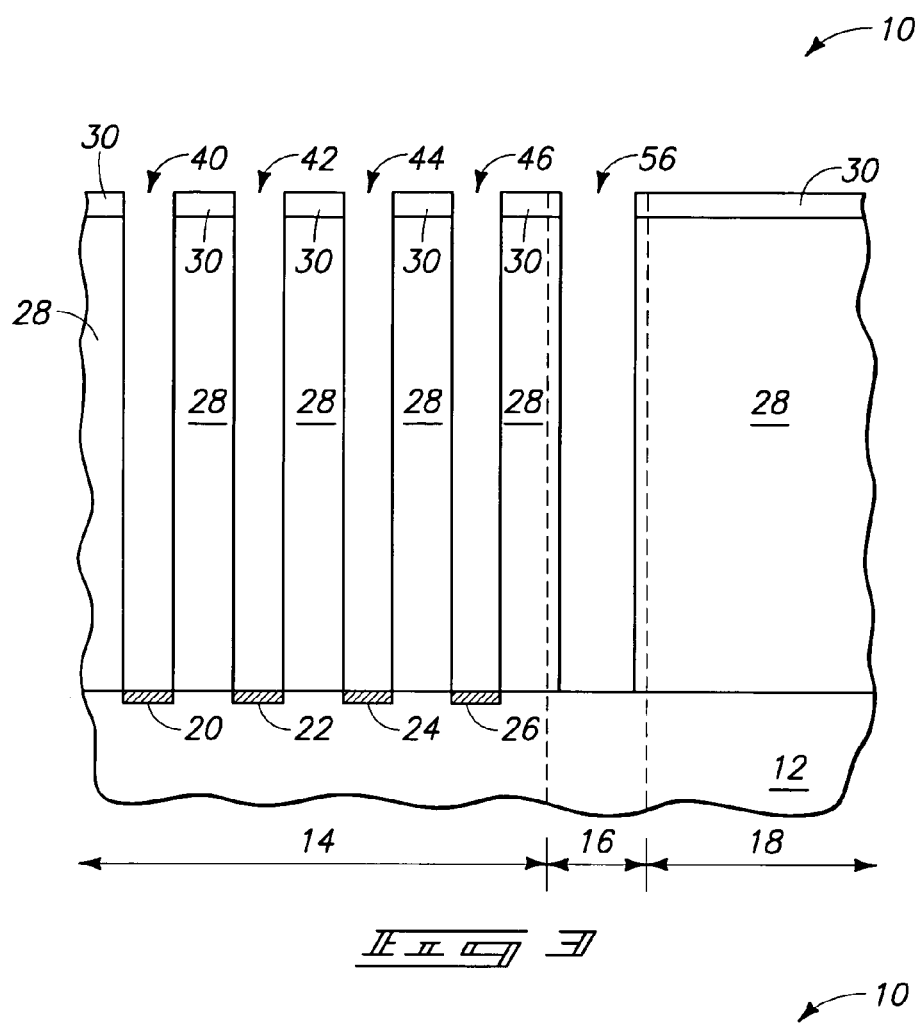
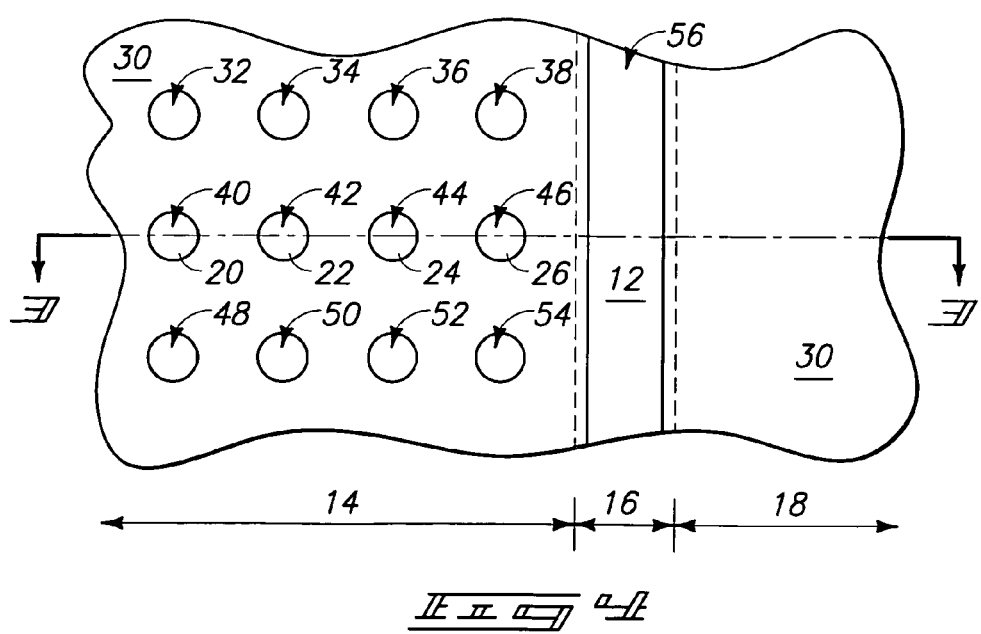

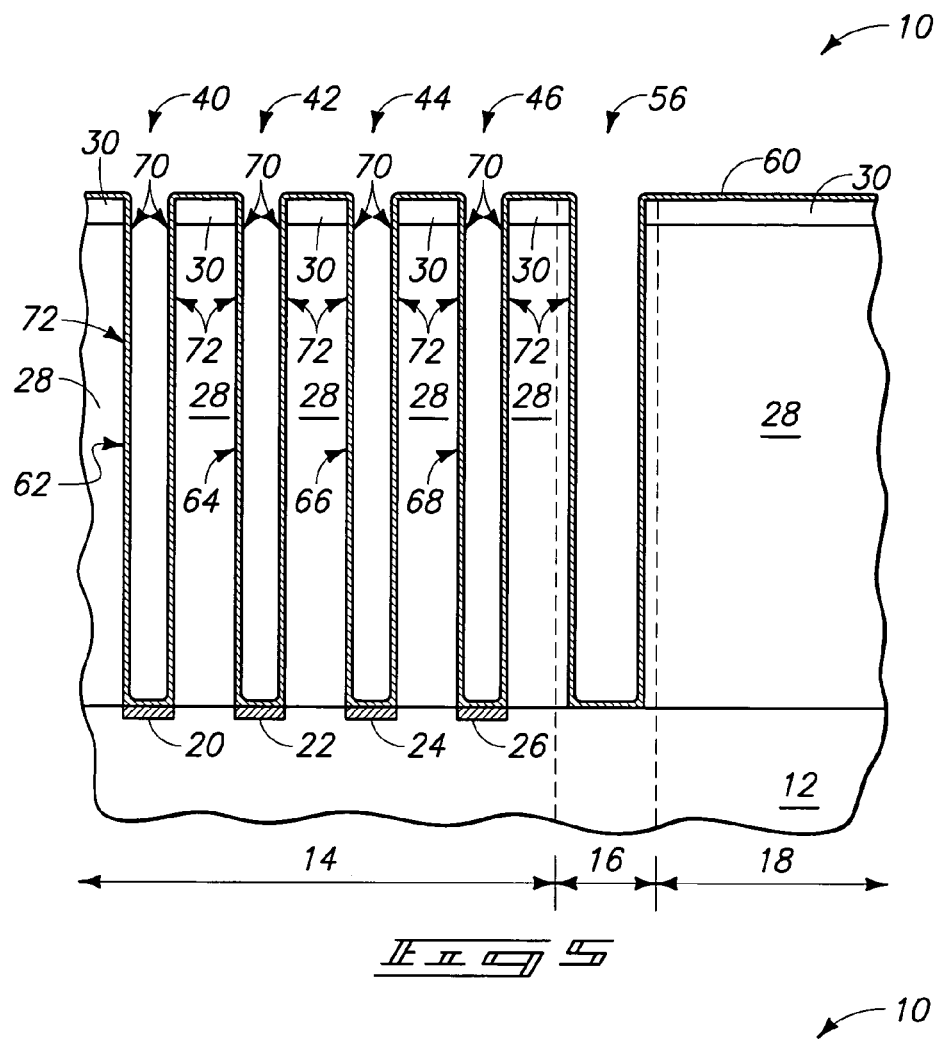
$F_{I\!I\!I\!I}$ $5$
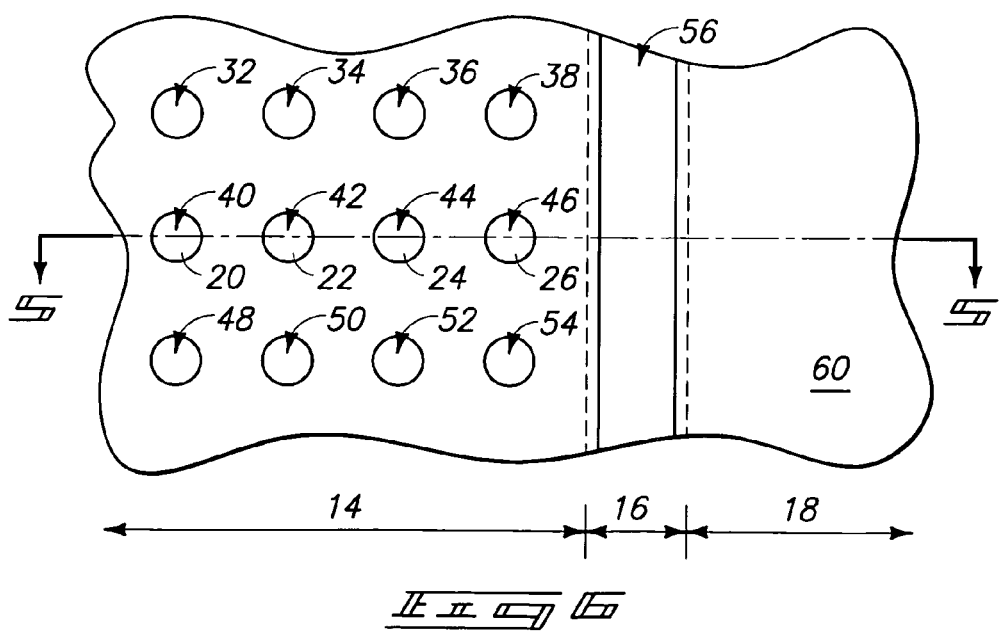
$F_{I\!I\!I\!I}$ $6$

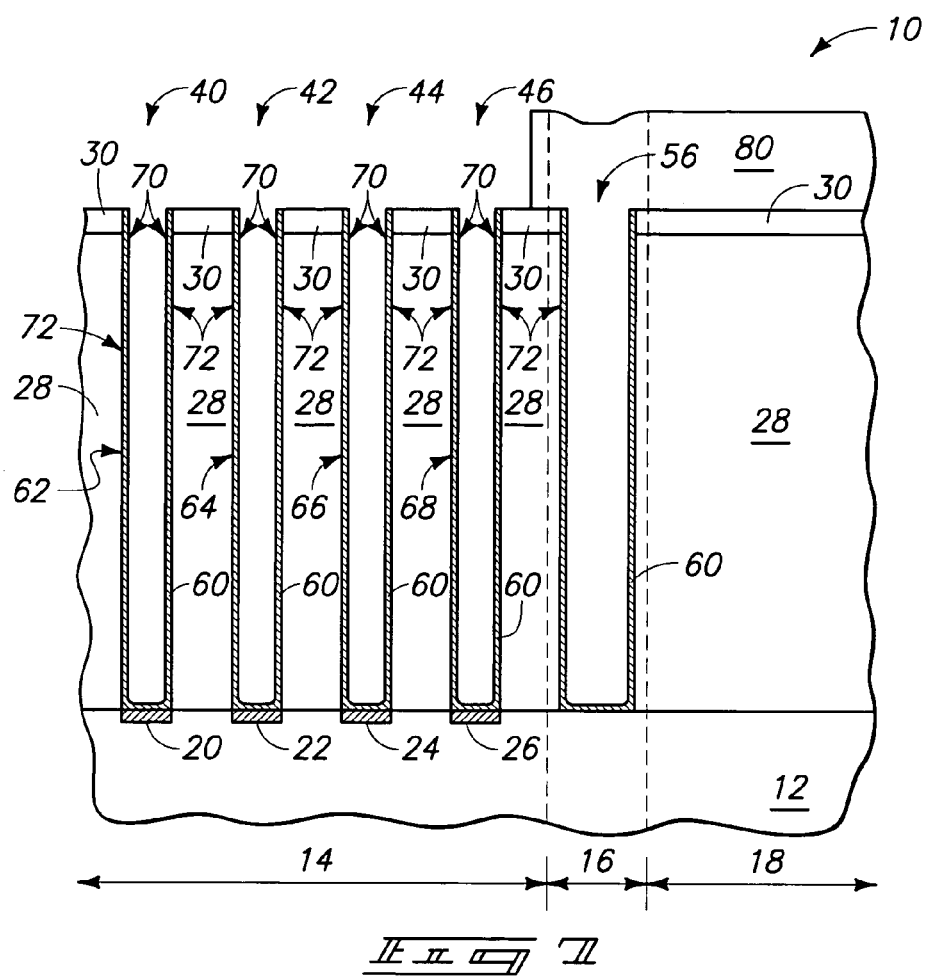
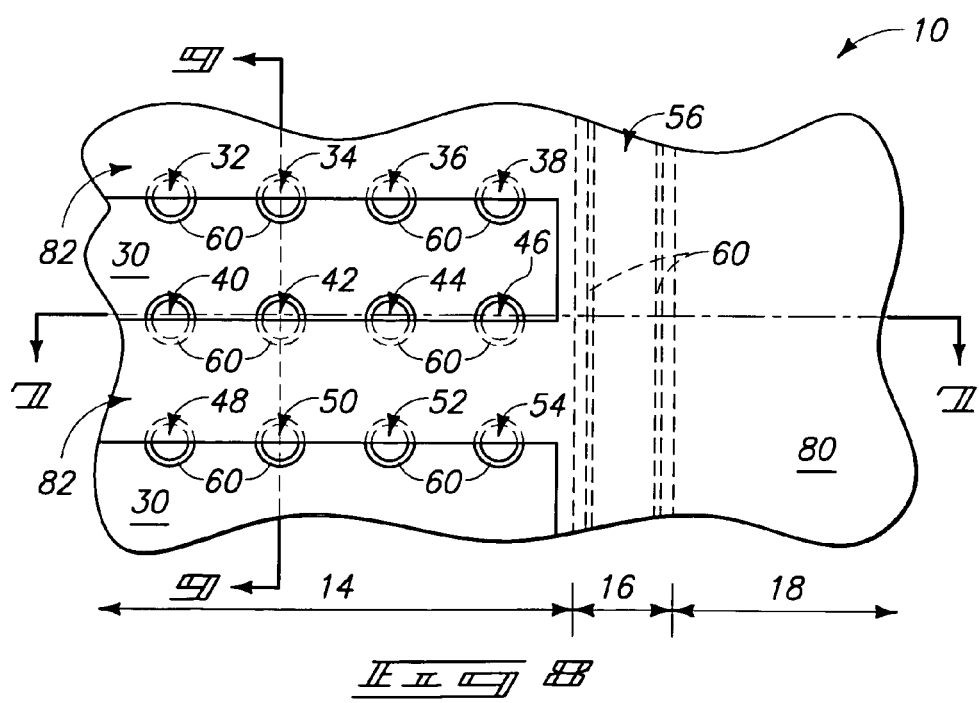

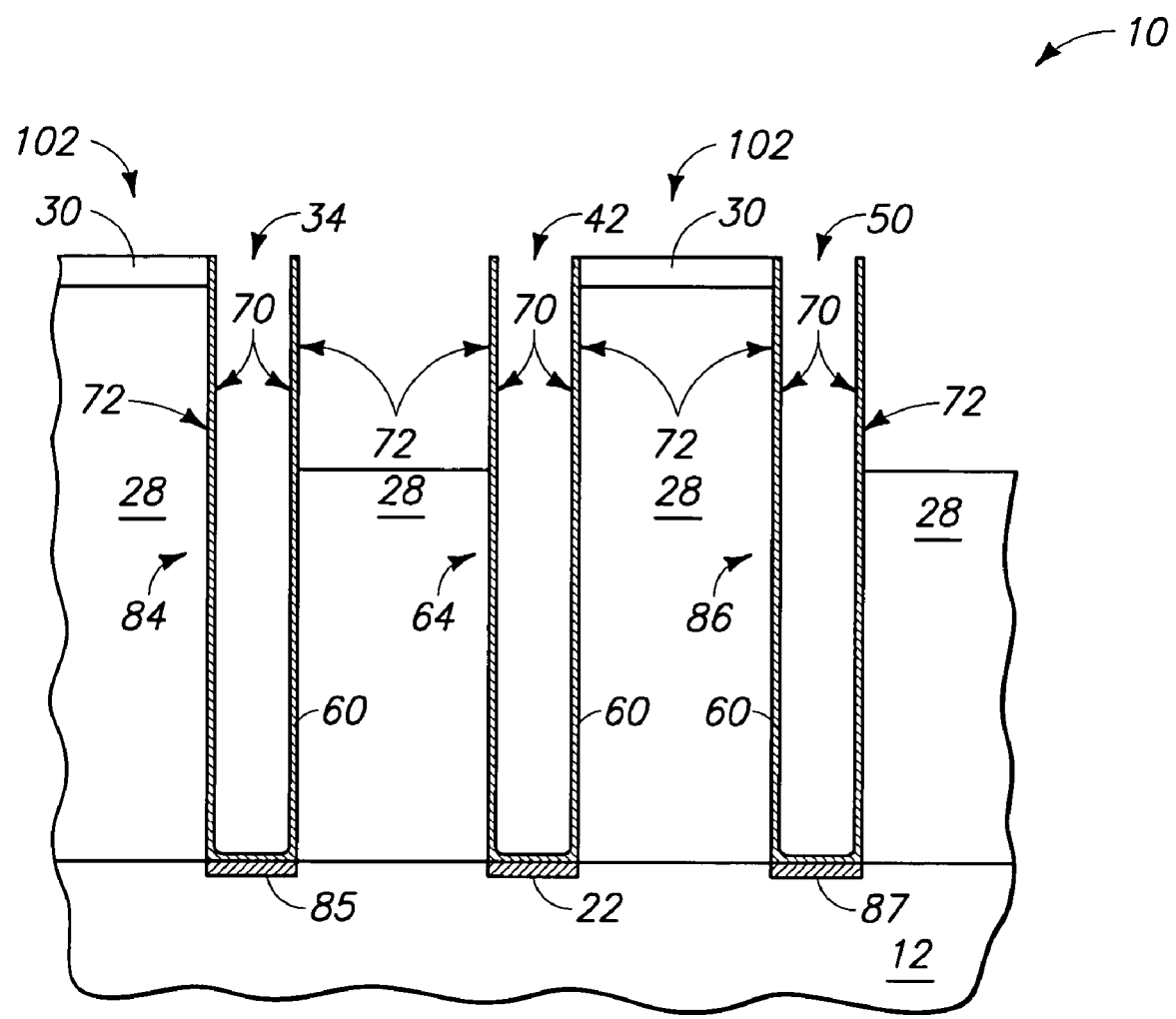
F I G 13

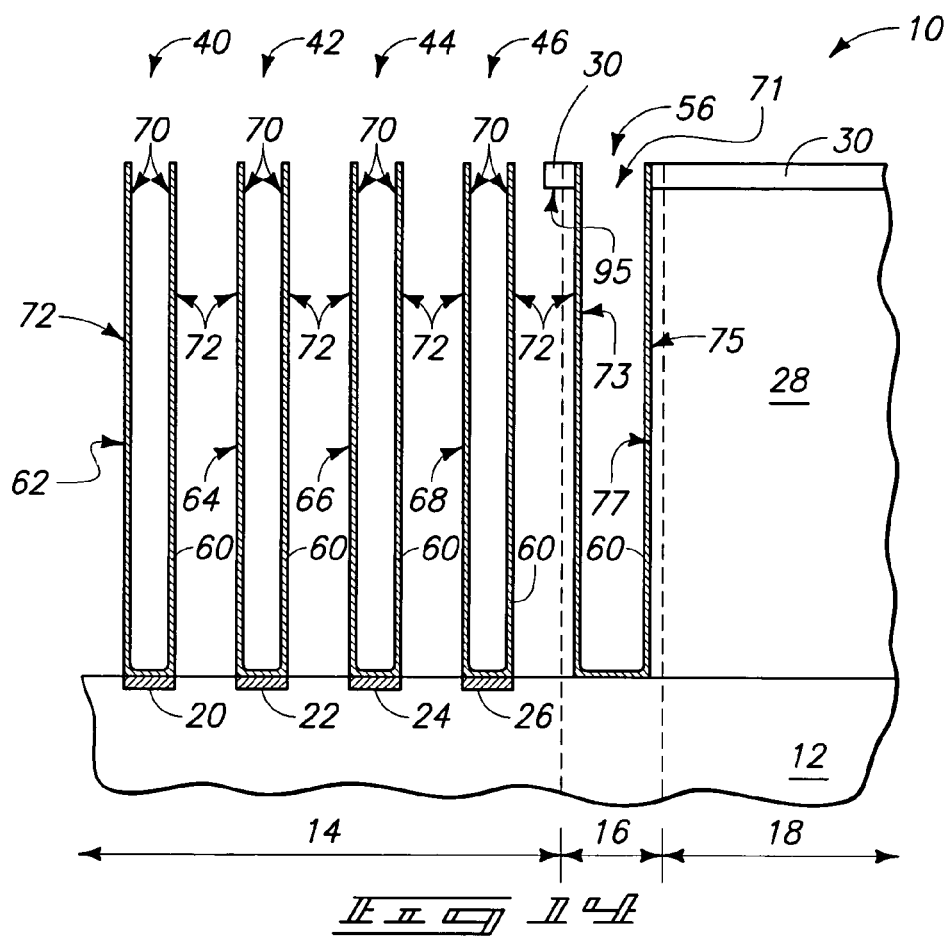
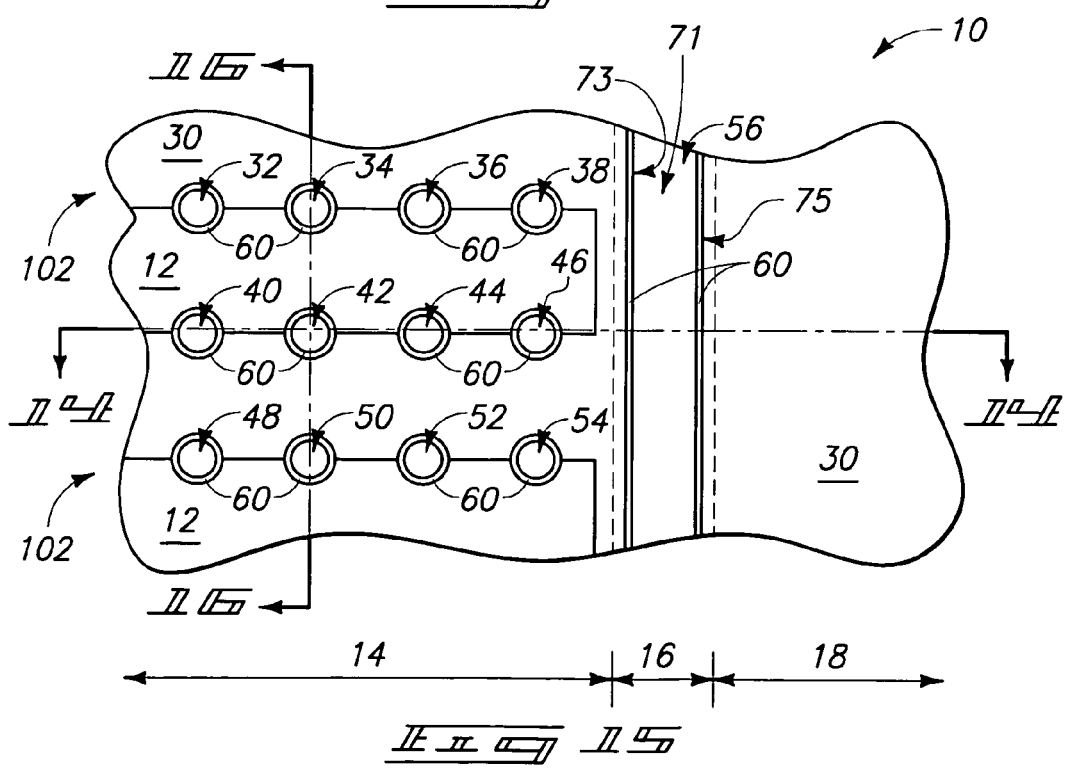

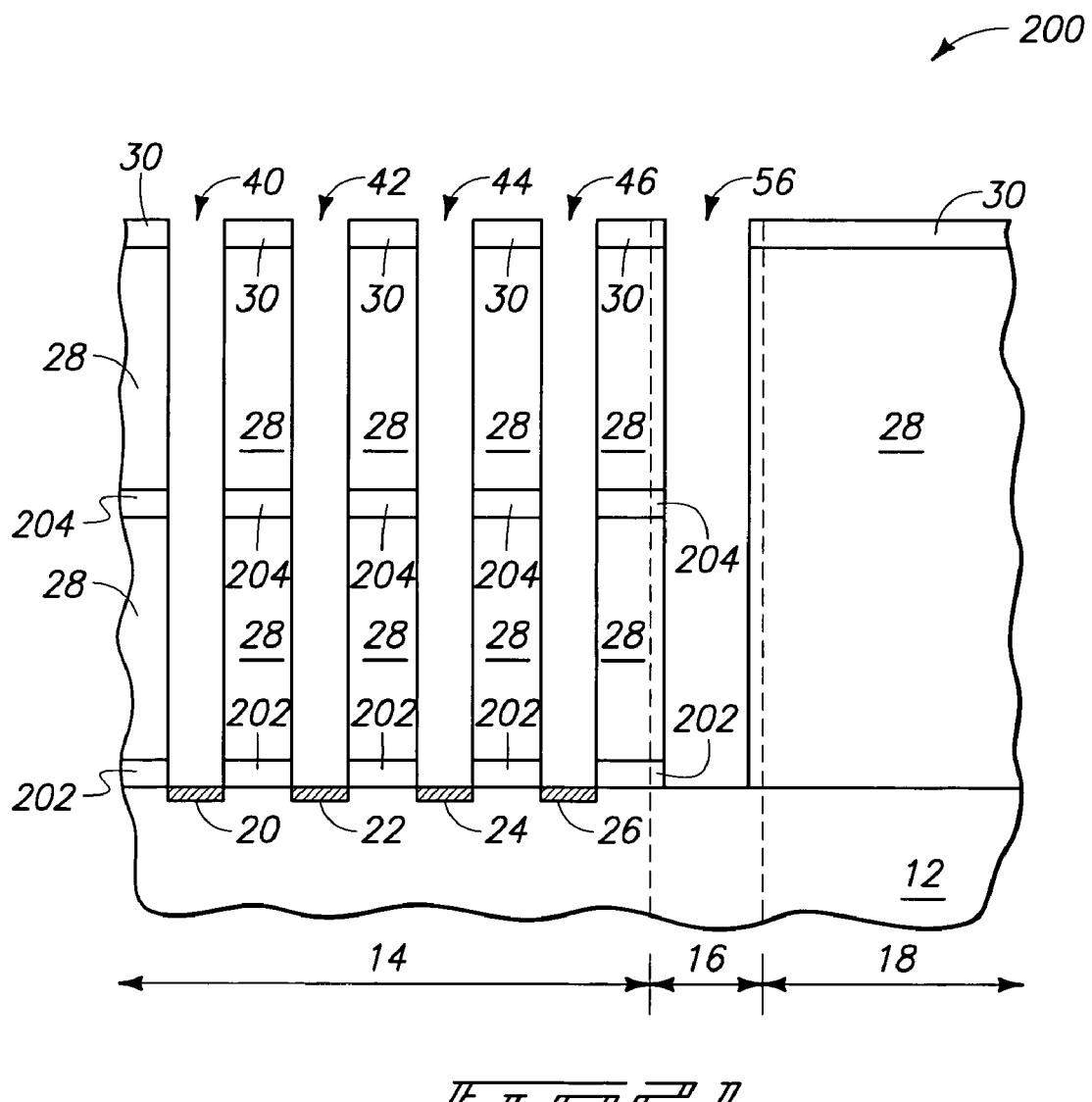
F I G 21

$F_{IG}$ 26

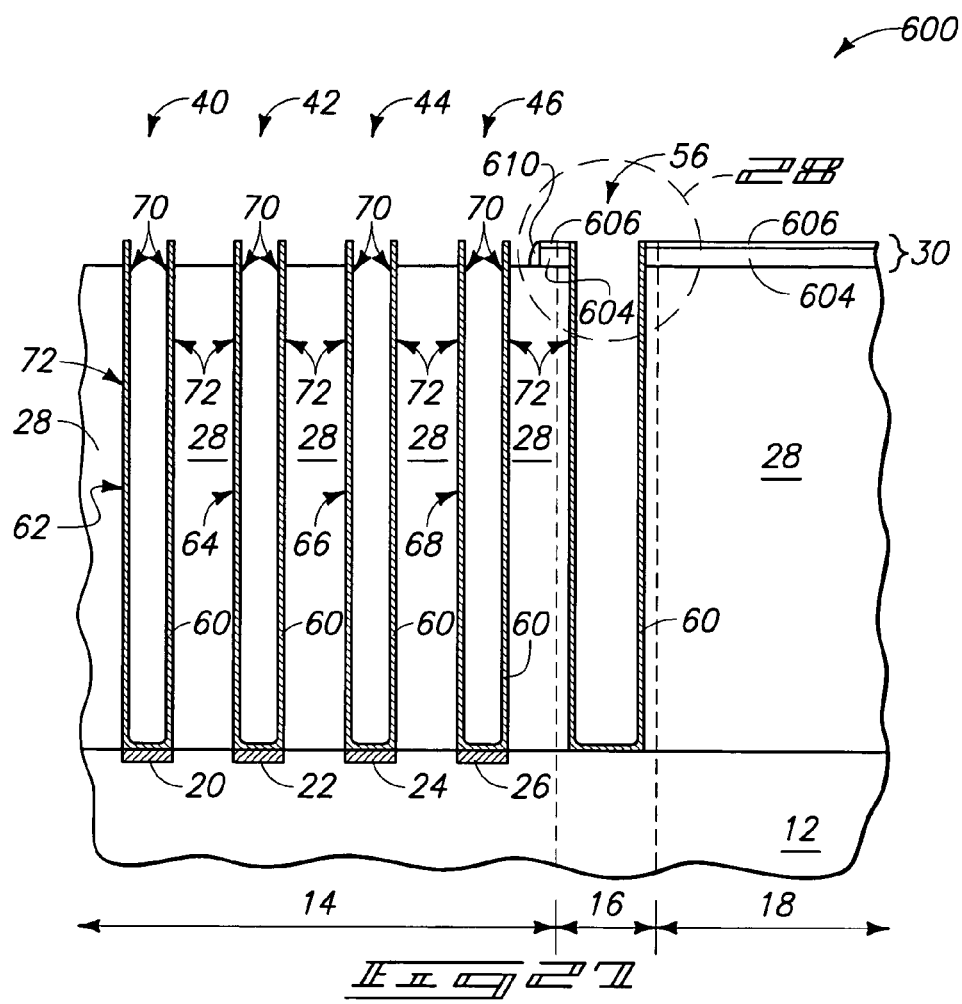
_Fig 27_
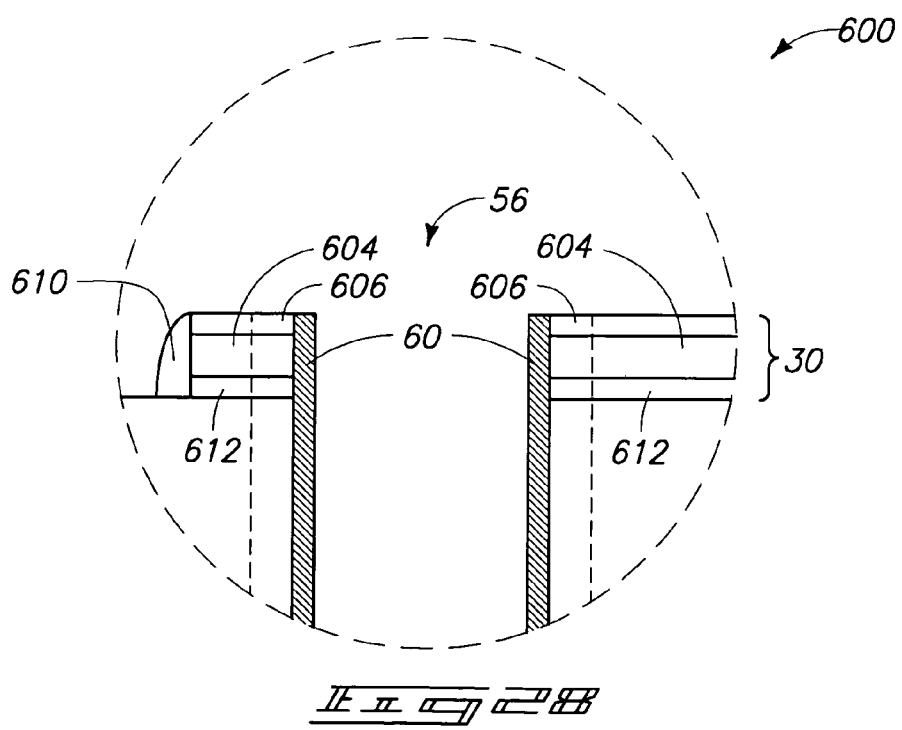
_Fig 28_

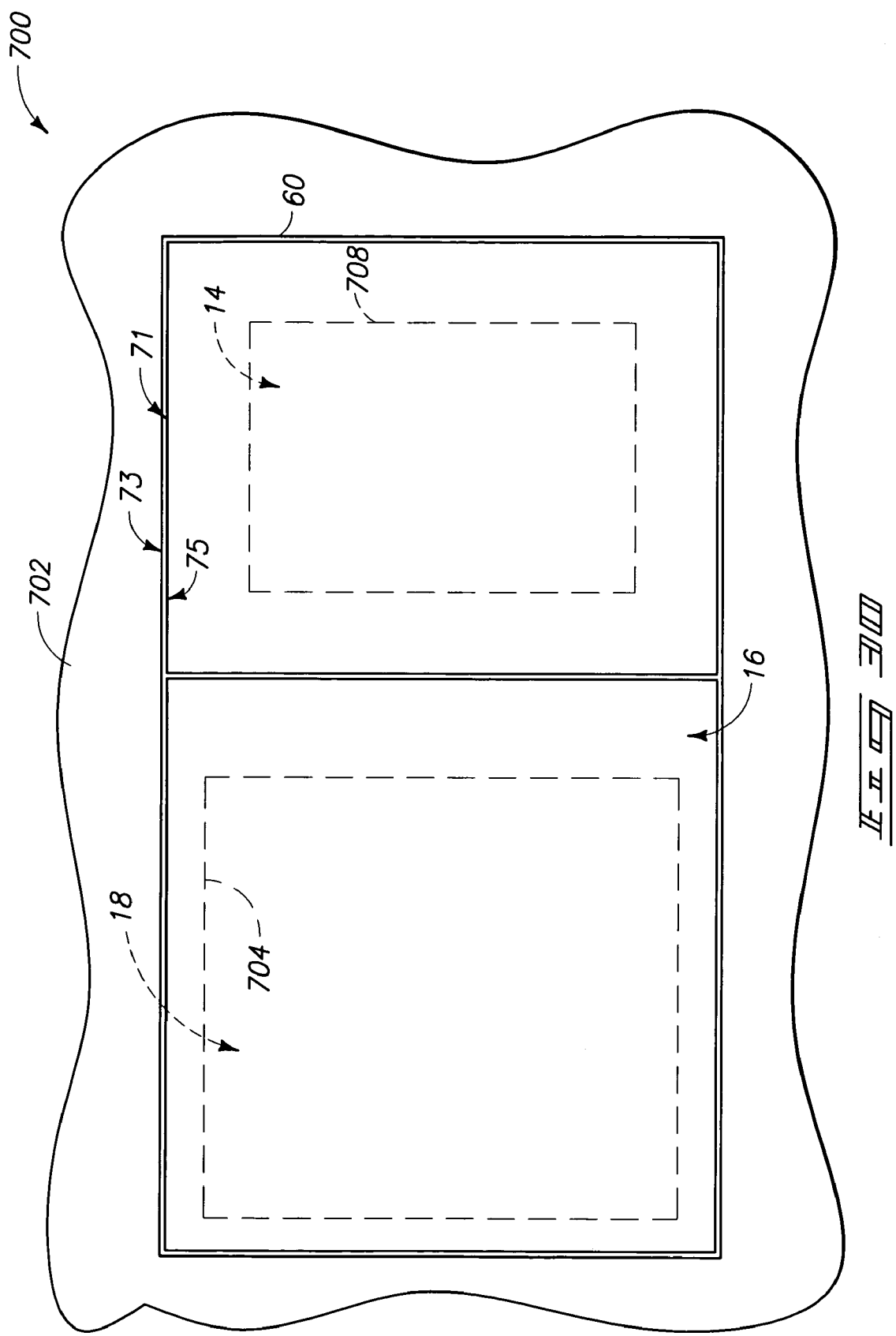

ical field

METHODS OF FORMING A PLURALITY OF CAPACITOR DEVICES

RELATED PATENT DATA

This patent resulted from a divisional application of U.S. patent application Ser. No. 10/733,181, which was filed Dec. 10, 2003 now U.S. Pat. No. 7,125,781; and which resulted from a continuation-in-part of U.S. patent application Ser. No. 10/656,732, which was filed Sep. 4, 2003 now U.S. Pat. No. 7,067,385.

TECHNICAL FIELD

The invention pertains to semiconductor constructions, and to methods of forming capacitor devices.

BACKGROUND OF THE INVENTION

Capacitor constructions continue to have increasing aspect ratios in higher generation integrated circuitry fabrication. For example, dynamic random access memory (DRAM) capacitors now have elevations of from 2 to 3 microns, with widths of about 0.1 micron. Further, it is a continuing goal to increase the density of semiconductor devices, with a corresponding goal to reduce the footprint associated with individual devices. As the packing density of capacitor devices becomes increasingly greater, the available surface area for capacitance decreases.

A common capacitor construction is a so-called container device. One of the electrodes of such device is shaped as a container, and subsequently dielectric material and another capacitor electrode are formed within the container. Typically, only the interior surfaces of the containers are being utilized for capacitance surface area. It would be desirable to utilize exterior surfaces of the containers for capacitance as well. Unfortunately, exposure of both the interior and exterior surfaces of a container having a high aspect ratio can render the container structurally weak, and subject to toppling or breaking from an underlying base. It would therefore be desirable to develop methods which enable exterior surfaces of high aspect ratio containers to be utilized as capacitive surfaces while avoiding toppling or other loss of structural integrity of the high aspect ratio containers.

Another type of capacitor structure is a so-called pedestal (or post) device. One of the electrodes of the device is shaped as a pedestal, and subsequently dielectric material and another capacitor electrode are formed over and around the pedestal. If the pedestal is tall and thin, it can be structurally weak and subject to toppling or breaking from an underlying base. It would therefore be desirable to develop methods which avoiding toppling or other loss of structural integrity of pedestals.

Although the invention is, at least in part, motivated by the problems discussed above, it is to be understood that the invention can have applications beyond the addressing of such problems.

SUMMARY OF THE INVENTION

In one aspect, the invention includes a method of forming a plurality of capacitor devices. Conductive storage node material is formed within openings in a mass. A retaining structure (which can be a lattice structure) is provided in physical contact with at least some of the conductive storage node material, and subsequently at least some of the mass is removed while utilizing the retaining structure to prevent collapse of the conductive storage node material. After removal of at least some of the mass, the conductive storage node material is incorporated into the plurality of capacitor devices. The conductive storage node material can be in the form of a plurality of container shapes in some aspects of the invention, and in the form of a plurality of pedestals (or posts) in other aspects of the invention.

In one aspect, the invention encompasses methods of forming capacitor devices in which a construction comprising a first material is formed over a substrate, and a retaining structure is formed over at least a portion of the first material. Openings are formed to extend into the first material, and a first conductive layer is formed within the openings. The first conductive layer within the openings forms container structures having outer sidewalls along the first material. At least some of the first material is removed to expose at least portions of the outer sidewalls of the container structures while utilizing the retaining structure to support the container structures and avoid collapse of the container structures. A capacitor dielectric material is formed along the exposed portions of the outer sidewalls and within the container structures. A second conductive layer is formed over the capacitor dielectric material. The second conductive layer, capacitor dielectric material and first conductive layer are together incorporated into capacitor devices.

In one aspect, the invention encompasses a method of forming capacitor devices utilizing a construction comprising a memory array region, a region other than the memory array region, and a location between the memory array region and said other region. The other region can be, for example, a peripheral region where logic circuitry is ultimately to be formed. A first material is formed to extend over the memory array region, the other region, and the location between the memory array region and said other region. A second material is formed over at least a portion of the first material that is over the memory array region, and over an entirety of the first material that is over said other region. Openings are formed to extend into the first material, and a trench is formed within the first material over the location between the memory array region and said other region. A first conductive layer is formed within the openings and within the trench. The first conductive layer within the openings forms container structures having outer sidewalls along the first material. After forming the first conductive layer and the second material, at least some of the first material is removed to expose at least portions of the outer sidewalls of the container structures. A capacitor dielectric material is formed along the exposed portions of the outer sidewalls and within the container structures, and a second conductive layer is formed over the capacitor dielectric material. The first conductive layer, second conductive layer and dielectric material are together incorporated into capacitor devices.

In one aspect, the invention includes semiconductor constructions. An exemplary semiconductor construction comprises a substrate having a memory array region defined therein together with a region other than the memory array region and a location between the memory array region and said other region. A plurality of container structures are across the memory array region. The container structures are electrically conductive. The container structures comprise inner sidewalls within the container structures and outer sidewalls in opposing relation to the inner sidewalls. An electrically insulative material is over said other region. The electrically insulative material has a lateral sidewall. An electrically conductive liner is along the sidewall of the material. A capacitor dielectric material is along the inner and outer sidewalls of the container structures. A second conductive layer is over the capacitor dielectric material. The container structures, dielectric material and second conductive material are together incorporated into a plurality of capacitor constructions.

BRIEF DESCRIPTION OF THE DRAWINGS

Preferred embodiments of the invention are described below with reference to the following accompanying drawings.

FIG. 3 is a diagrammatic, cross-sectional view of the FIG. 1 wafer fragment shown at a processing step subsequent to that of FIG. 1.

FIG. 4 is a fragmentary top view of a semiconductor construction comprising the fragment of FIG. 3 along the line 3—3.

FIG. 5 is a diagrammatic, cross-sectional view of the semiconductor wafer fragment of FIG. 1 at a processing stage subsequent to that of FIG. 3.

FIG. 6 is a diagrammatic top view of a semiconductor construction comprising the fragment of FIG. 5 along the line 5—5.

FIG. 7 is a view of the cross-section of FIG. 1 shown at a processing stage subsequent to that of FIG. 5.

FIG. 8 is a diagrammatic top view of a semiconductor wafer fragment comprising the cross-section of FIG. 7 along the line 7—7.

FIG. 13 is a view along the line 12—12 of FIG. 11, and shows a processing stage alternative to that of FIG. 12.

FIG. 14 is a view of the cross-section of FIG. 1 shown at a processing stage subsequent to that of FIG. 10.

FIG. 15 is a diagrammatic top view of a fragment of a semiconductor construction comprising the cross-section of FIG. 14 along the line 14—14.

FIG. 21 is a view of the FIG. 20 cross-section shown at a processing stage subsequent to that of FIG. 20.

FIG. 27 is a view of the FIG. 26 cross-section shown at a processing stage subsequent to that of FIG. 26, with the processing stage of FIG. 27 being analogous to the stage shown in FIG. 10.

FIG. 28 is a diagrammatic, cross-sectional view of the portion illustrated as 28 in FIG. 27, and is shown in accordance with an aspect of the invention alternative to that of FIG. 27.

FIG. 30 is a diagrammatic top view of a fragment of a semiconductor construction illustrating another exemplary liner formed in accordance with an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention includes methodology for forming capacitor constructions in which a retaining structure, or lattice, is utilized to hold capacitor electrode structures (such as containers or pedestals) as outer sidewalls of the capacitor electrode structures are exposed with an etch. The retaining structure can thus alleviate, and preferably prevent, toppling and other structural defects occurring to the capacitor electrode structures as the outer surfaces of the structures are exposed. The capacitor electrode structures can be storage node structures.

A particular aspect of the invention includes methodology for forming container capacitor constructions in which a retaining structure, or lattice, is utilized to hold conductive containers as outer sidewalls of the containers are exposed with an etch. The retaining structure can thus alleviate, and preferably prevent, toppling and other structural defects occurring to the containers as the outer surfaces of the containers are exposed. The lattice utilized to retain the containers is rigid enough to provide support for the containers, but also has holes, or grooves, patterned into it to allow wet or gaseous removal of material from adjacent the containers, which ultimately exposes outer surfaces of the containers. The removal of material from adjacent the containers can be accomplished using an isotropic etch.

In typical processing, a semiconductor wafer will have one region corresponding to a memory array, and another region peripheral to the memory array in which logic or other circuitry is to be formed. Methodology of the present invention can form the retaining lattice over the memory array, while utilizing the same material as that utilized in the lattice to form a protective layer over the peripheral region to protect the peripheral region from the etch utilized to expose outer surfaces of capacitor electrode structures in the memory array. The invention can also encompass formation of a trench in a location between the memory array region and the peripheral region, and provision of a protective material within the trench which protects a lateral periphery of the peripheral region from attack by etchants utilized to remove material from the memory array region during exposure of outer surfaces of the capacitor electrode structures.

Various aspects of the invention are described below with reference to FIGS. 1–30.

Figure 1:
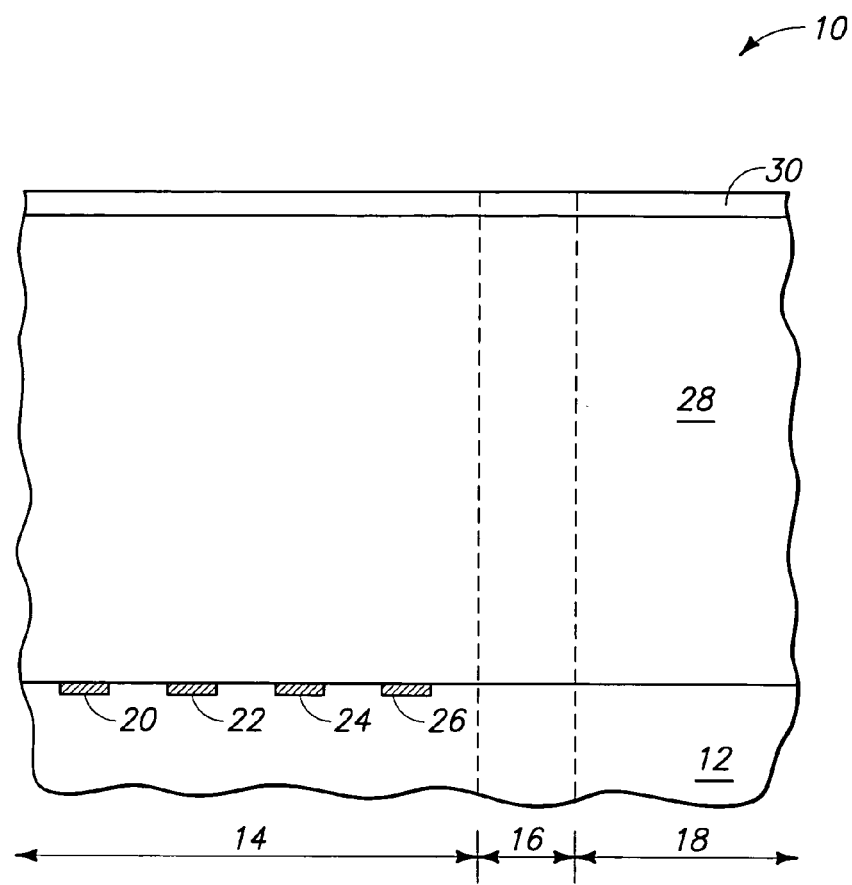
FIG. 1 is a diagrammatic, cross-sectional view of a semiconductor wafer fragment at a preliminary processing stage of an exemplary aspect of the present invention.

Referring initially to FIG. 1, a semiconductor wafer fragment 10 is shown at a preliminary processing stage of an exemplary aspect of the present invention. Fragment 10 comprises a substrate 12. Substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is divided into three defined regions 14, 16 and 18. Region 14 corresponds to a memory array region. Region 18 corresponds to a region other than the memory array region, and can correspond to, for example, a so-called peripheral region. The region is referred to as a peripheral region because it is peripheral to the memory array region. Typically, logic circuitry and other circuitry associated with the control of data flow to and from memory devices associated with memory array region 14 would be associated with peripheral region 18. Region 16 corresponds to a location between the memory array region 14 and the peripheral circuitry associated with region 18. Dashed lines are provided through construction 10 to demarcate the various defined regions 14, 16 and 18 extending within the structure. Various circuit devices (not shown) could be associated with region 18 at the processing stage of FIG. 1.

A plurality of electrically conductive node locations 20, 22, 24 and 26 are shown within memory array region 14 of substrate 12. Node locations 20, 22, 24 and 26 can correspond to, for example, conductively-doped diffusion regions within a semiconductive material of substrate 12, and/or to conductive pedestals associated with substrate 12. Although the node locations are shown to be electrically conductive at the processing stage of FIG. 1, it is to be understood that the electrically conductive materials of the node locations could be provided at a processing stage subsequent to that of FIG. 1 in various other aspects of the invention (not shown). Node locations 20, 22, 24 and 26 can ultimately be electrically connected with transistor constructions (not shown in FIG. 1) and can correspond to source/drain regions of the transistor constructions, or can be ohmically connected to source/drain regions of the transistor constructions. Transistor gates and other components of the transistor constructions can be present within memory array region 14 at the processing stage of FIG. 1, or can be formed in subsequent processing.

A mass 28 is formed over substrate 12. Mass 28 can comprise a single homogeneous layer (as shown), or can comprise multiple layers of differing composition and/or physical properties. Mass 28 can comprise, consist essentially of, or consist of one or more electrically insulative materials. In particular aspects, mass 28 will comprise, consist essentially of, or consist of one or more of borophosphosilicate glass (BPSG), spin-on-glass (SOG), silicon dioxide, phosphosilicate glass (PSG), borosilicate glass (BSG), undoped glass, and silicon nitride. In some aspects, mass 28 will comprise, consist essentially of, or consist of silicon and oxygen. Mass 28 can have a thickness over substrate 12 of, for example, from about 5,000 Å to about 50,000 Å, and typically will have a thickness of about 20,000 Å.

A retaining structure (also referred to as a lattice structure) 30 is formed over mass 28. Retaining structure 30 can comprise a single homogeneous composition, or can comprise two or more layers of differing composition. In subsequent processing (described below) at least some of mass 28 is selectively etched relative to at least some of retaining material 30. Accordingly, retaining material 30 preferably comprises a composition to which at least some of mass 28 can be selectively etched. In particular aspects, mass 28 can be considered to comprise a first material, and structure 30 can be considered to comprise a second material to which the first material is ultimately selectively etched. In some aspects, retaining structure 30 will comprise, consist essentially of, or consist of silicon and nitrogen. In an exemplary aspect, mass 28 will comprise, consist essentially of, or consist of borophosphosilicate glass and retaining structure 30 will comprise, consist essentially of, or consist of silicon nitride. In another exemplary aspect, mass 28 will comprise, consist essentially of, or consist of doped or undoped silicon-containing glass and composition 30 will comprise one or more layers consisting essentially of, or consisting of silicon nitride; together with one or more layers consisting essentially of, or consisting of silicon. The layers consisting essentially of silicon, or consisting of silicon, can comprise amorphous silicon and/or polycrystalline silicon.

If retaining structure 30 consists essentially of, or consists of silicon nitride, the structure can have a thickness of from about 50 Å to about 3,000 Å, and typically will have a thickness of about 700 Å. If structure 30 comprises a stack of layers of silicon nitride and silicon; the layers of silicon nitride can have a thickness of from about 50 Å to about 3,000 Å, with a typical thickness being about 300 Å; and the layers of silicon can have a thickness of from about 50 Å to about 1,000 Å, with a typical thickness being about 200 Å. In particular aspects, structure 30 can comprise a layer consisting essentially of, or consisting of silicon nitride sandwiched between a pair of layers consisting essentially of, or consisting of silicon. In such aspects, the layers of silicon can have thicknesses of from about 50 Å to about 500 Å, with a typical thickness being about 200 Å; and the middle layer of silicon nitride can have a thickness of from about 50 Å to about 1,000 Å, with a typical thickness being about 300 Å.

Figure 2:
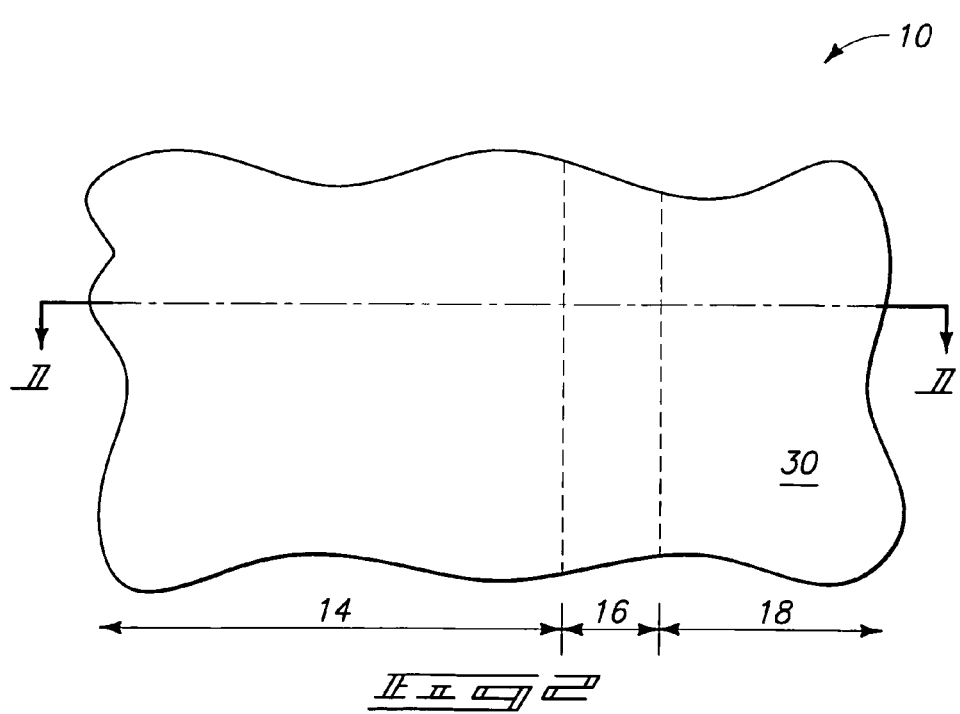
FIG. 2 is a fragmentary top view of a semiconductor wafer fragment comprising the cross-section of FIG. 1 along the line 1—1.

FIG. 2 shows a top view of a semiconductor wafer fragment comprising the FIG. 1 cross-section, and shows retaining structure 30 extending entirely across the upper surface of the semiconductor construction.

Referring next to FIGS. 3 and 4, openings 32, 34, 36, 38, 40, 42, 44, 46, 48, 50, 52 and 54 are formed through retaining structure 30, mass 28, and to the node locations associated with an upper surface of substrate 12, (with the node locations 20, 22, 24 and 26 being shown in FIG. 3). The openings can have a very high aspect ratio, and ultimately are utilized for forming capacitor containers (as discussed below). In particular aspects, the openings can have an elevation of from about 2 to about 3 microns, and a maximum width of about 0.1 micron. The openings are shown to have circular outer peripheries (as illustrated by the top view of FIG. 4), but it is to be understood that the openings can have other shapes. The openings 32, 34, 36, 38, 40, 42, 44, 46, 48, 50, 52, and 54 are ultimately utilized to form containers of capacitor constructions, as discussed in more detail below.

The openings 32, 34, 36, 38, 40, 42, 44, 46, 48, 50, 52, and 54 are formed over memory array region 14 of construction 10, and while the openings are formed a trench 56 is formed within location 16 of construction 10. Although trench 56 is shown formed simultaneously with the openings over memory array region 14, and accordingly is shown formed utilizing the same etch as that used to form the openings, it is to be understood that the trench can be, in alternative processing (not shown), formed with an etch separate from that utilized to form the openings over the memory array region. In such aspects, the etch utilized to form the trench can be conducted either prior to, or after, the etch utilized to form the container openings associated with memory array region 14.

The formation of the container openings within memory array region 14 and the trench within location 16 would typically be accomplished by first forming a photoresist mask (not shown) with photolithographic processing, and subsequently transferring a pattern from the patterned mask to underlying materials 28 and 30, followed by removal of the patterned photoresist mask. The photolithographic requirements associated with formation of the patterned mask can be relatively stringent, and accordingly an antireflective layer (not shown) can be incorporated into structure 30, formed beneath structure 30, or formed over structure 30 in various aspects of the present invention. The antireflective coating can comprise, for example, either a hard film (for example, dielectric antireflective coating, (DARC)), or a spin-on film (for example, bottom antireflective coating, (BARC)).

Openings 32, 34, 36, 38, 40, 42, 44, 46, 48, 50, 52 and 54 are formed in an array within memory region 14. Such array comprises rows and columns. The rows can be considered to extend horizontally in the view of FIG. 4, and the columns can be considered to extend vertically in the view of FIG. 4.

Although openings 32, 34, 36, 38, 40, 42, 44, 46, 48, 50, 52 and 54 are described as extending through material 28 to underlying conductive nodes (such as nodes 20, 22, 24, and 26) it is to be understood that one or more other layers (not shown) can be provided between the nodes and material 28, and that the openings can stop on the other layers. For instance, an etch stop layer (not shown) can be provided between material 28 and nodes 20, 22, 24, and 26 so that the openings stop on the etch stop layer. The etch stop layer can protect underlying materials (such as the surface of substrate 12 and/or electrical devices (not shown) supported by the surface during a subsequent isotropic etch of material 28 (discussed below). The openings can be extended through the etch stop and to nodes 20, 22, 24, and 26 with a second etch after the etch through material 28. The etch stop can comprise any suitable material to which material 28 can be selectively etched, and can, for example, comprise, consist essentially of or consist of silicon nitride.

Referring next to FIGS. 5 and 6, a conductive layer 60 is formed within openings 32, 34, 36, 38, 40, 42, 44, 46, 48, 50, 52 and 54, as well as within trench 56. Electrically conductive layer 60 can be a homogeneous composition of electrically conductive material, or can comprise multiple layers of electrically conductive material. Accordingly, layer 60 can comprise, consist essentially of, or consist of one or more electrically conductive materials. The electrically conductive materials within layer 60 can comprise any suitable materials, including, for example, conductively-doped silicon, metal, and metal compounds. In particular aspects, layer 60 will comprise titanium nitride.

Portions of layer 60 within the openings in memory array region 14 can be considered to form container structures within the openings. For instance, FIG. 5 shows the portions of layer 60 within openings 40, 42, 44 and 46 corresponding to container constructions 62, 64, 66 and 68. The container constructions can be considered to comprise inner surfaces 70 within the openings and outer surfaces 72 laterally opposed to the inner surfaces. The outer surfaces 72 extend along mass 28 and retaining structure 30.

Conductive layer 60 is ultimately incorporated into a capacitor electrode, and in particular aspects can be incorporated into a capacitor storage node. Accordingly, layer 60 can be referred to as capacitor electrode material, and in particular aspects can be referred to as electrically conductive storage node material.

Conductive material 60 is shown to only partially fill the openings 32, 34, 36, 38, 40, 42, 44, 46, 48, 50, 52 and 54, and thus to form container structures within the openings. In other aspects of the invention (not shown) the conductive material 60, either alone or in combination with other conductive materials, can completely fill the openings to form pedestal (or post) structures within the openings. The structures formed from conductive material 60 in the openings (i.e., the container structures or pedestal structures) can be referred to as conductive structures.

Figure 9:
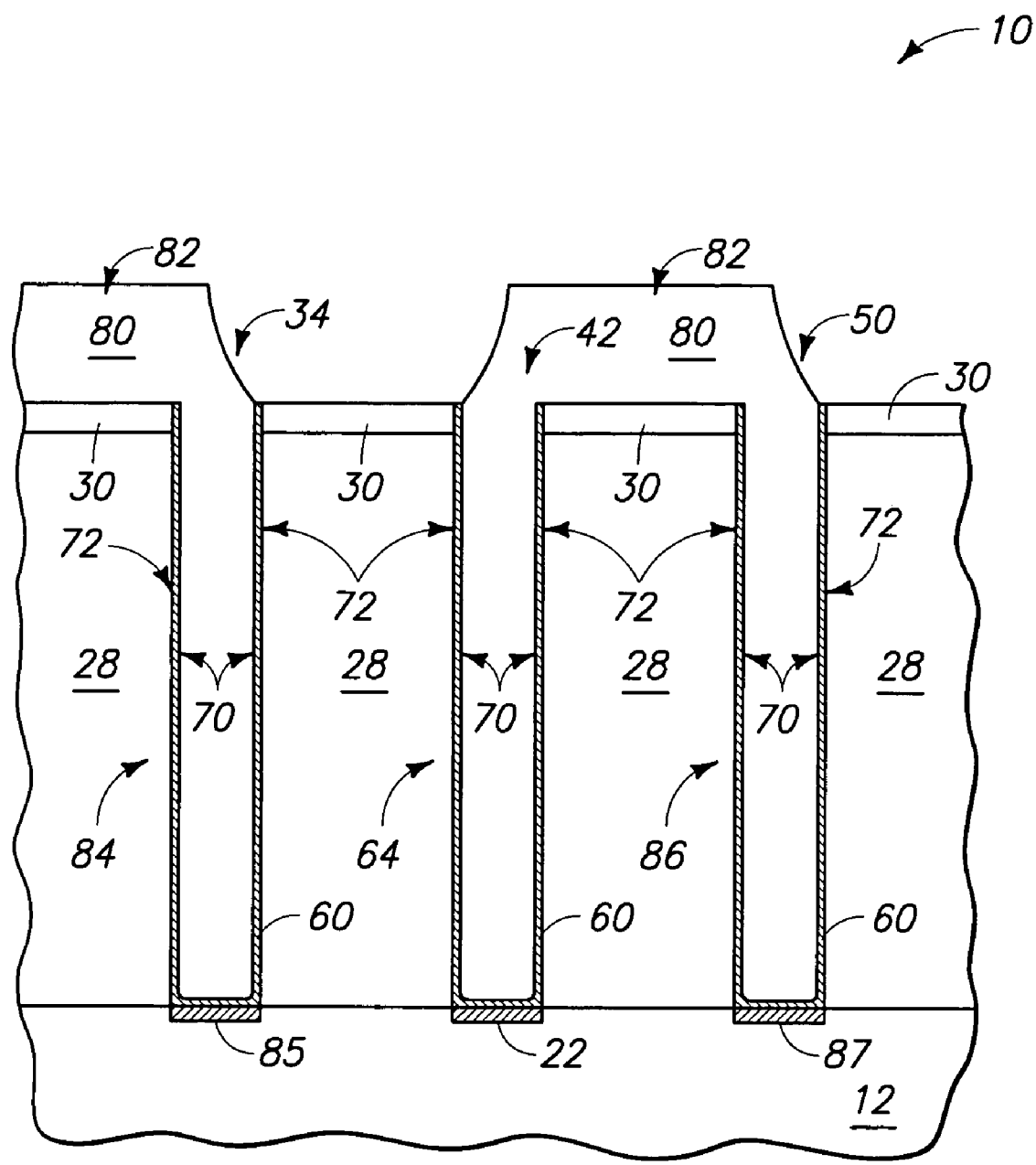
FIG. 9 is a diagrammatic, cross-sectional view along the line 9—9 of the FIG. 8 fragment, and illustrates a slightly different aspect of the invention than FIGS. 7 and 8.

Referring next to FIGS. 7–9, conductive material 60 is removed from over an upper surface of structure 30 to electrically isolate conductive structures within openings 32, 34, 36, 38, 40, 42, 44, 46, 48, 50, 52 and 54 (such as, for example, the container structures 62, 64, 66 and 68 of FIG. 7) from one another. An exemplary method for removing conductive material 60 from over upper surface 30 is chemical-mechanical polishing. After removal of conductive material 60 from over retaining structure 30, the conductive material 60 remaining as conductive structures (i.e., as the shown container structures or as pedestals) within the openings remains directly against (i.e., in physical contact with) the retaining structure 30.

After removal of material 60 from over the upper surface of structure 30, a patterned mask 80 is formed over memory array region 14, peripheral region 18, and the location 16 between regions 14 and 18. Mask 80 entirely covers regions 16 and 18, but is patterned over region 14 to form rows 82 connecting pairs of capacitor rows. Portions of material 60 in openings 32, 34, 36, 38, 40, 42, 44, 46, 48, 50, 52 and 54 are shown in phantom view in FIG. 8 to indicate that such portions are covered by masking material 80. An exemplary material of mask 80 is photoresist, and such can be formed into the shown pattern utilizing photolithographic processing. The illustrated shape of patterned mask 80 is but one of many possible patterns that can be utilized in methodology of the present invention. The shown shape of patterned mask 80 has strips extending horizontally relative to the view of FIG. 8. In other exemplary shapes (not shown) patterned strips of material 80 can extend to entirely cover particular containers, to extend diagonally relative to the view of FIG. 8 and/or to extend vertically relative to the view of FIG. 8.

The conductive material 60 within trench 56 is shown in phantom view in FIG. 8 to indicate that such material is covered by masking material 80.

FIG. 9 shows containers 84 and 86 associated with openings 34 and 50, in addition to the container 64 associated with opening 42. Containers 84 and 86 extend to node locations 85 and 87, which can comprise similar constructions to those described above relative to node location 22. Container constructions 84 and 86 comprise the interior peripheries 70 and outer peripheries 72 described previously with reference to containers 62, 64, 66 and 68 of FIG. 5. In the shown aspect of the invention, masking material 80 extends into openings 34, 42 and 50. Specifically, the masking material extends along the interior lateral surfaces 70 of each of the openings, and in the shown aspect extends entirely along at least one of the interior lateral surfaces 70 of each of the openings. In typical processing, a sacrificial material (not shown) would be provided in openings 32, 34, 36, 38, 40, 42, 44, 46, 48, 50, 52 and 54 during the above-described chemical-mechanical polishing of layer 60. The sacrificial material can be removed from within the openings at any suitable processing stage, which may be a stage before provision of masking material 80, or a stage after provision of masking material 80. If the sacrificial material remains in the openings during provision of masking material 80, the sacrificial material may preclude material 80 from entering the openings. In such aspects, material 80 may not be along the interior surfaces of the openings, but instead would be over the openings. In some aspects it can be desired to leave the sacrificial material within the openings during provision of masking material 80 to alleviate thinning of material 80 that might otherwise occur, and in other aspects it can be desired to remove the sacrificial material prior to formation of masking material 80. The illustration of FIG. 9 is somewhat inconsistent with FIGS. 7 and 8 in that FIG. 9 shows material 80 extending within the opening 42 and FIGS. 7 and 8 show opening 42 having a region within which material 80 does not extend. Thus, FIG. 9 illustrates a slightly different aspect of the invention than FIGS. 7 and 8.

Figure 10:
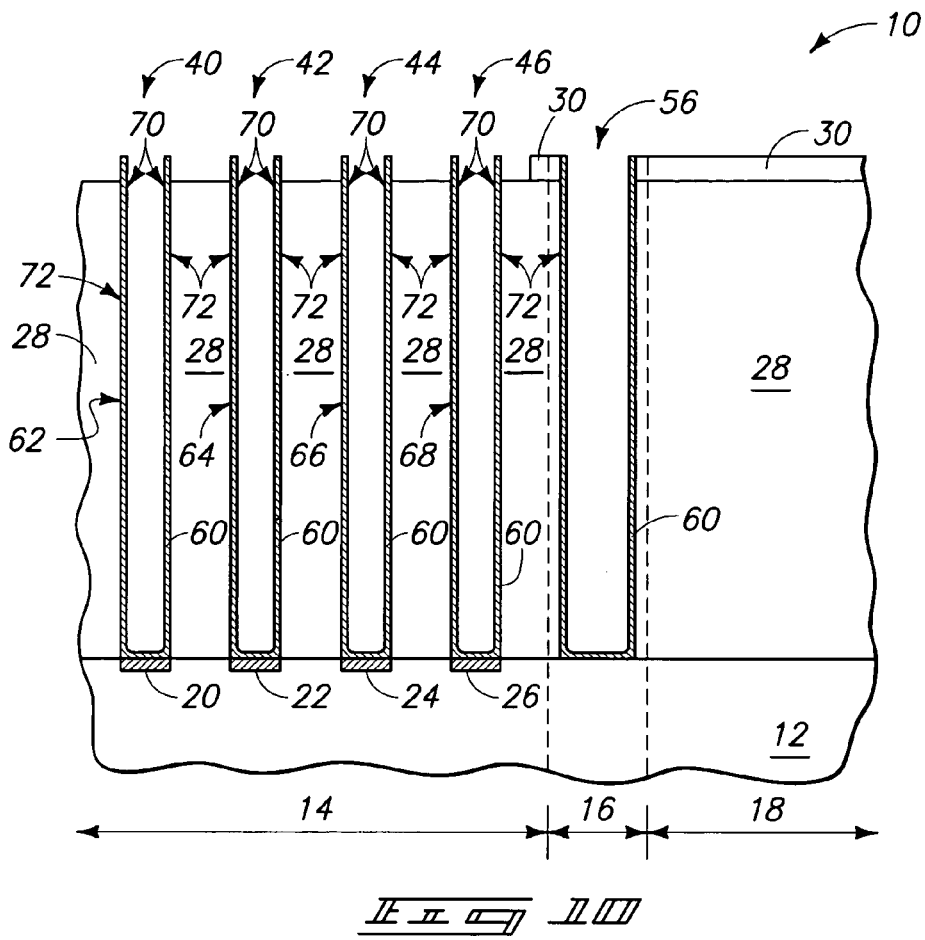
FIG. 10 is a view of the cross-section of FIG. 1 shown at a processing stage subsequent to that of FIG. 7.
Figure 11:
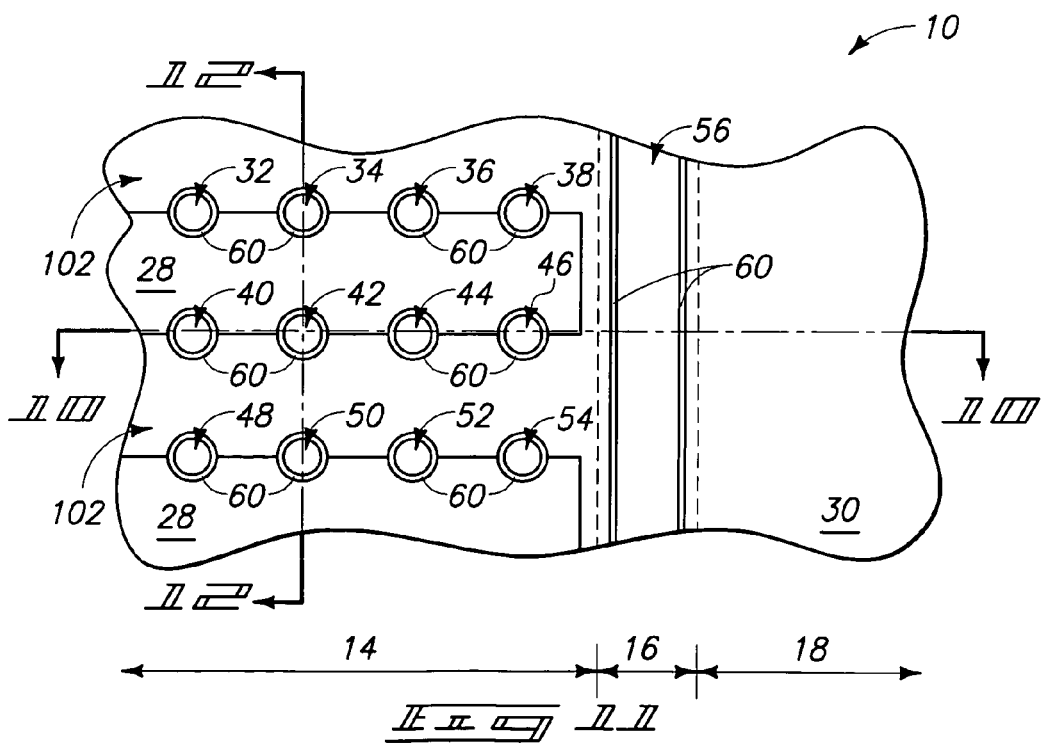
FIG. 11 is a diagrammatic top view of a semiconductor construction comprising the cross-section of FIG. 10 along the line 10—10.
Figure 12:
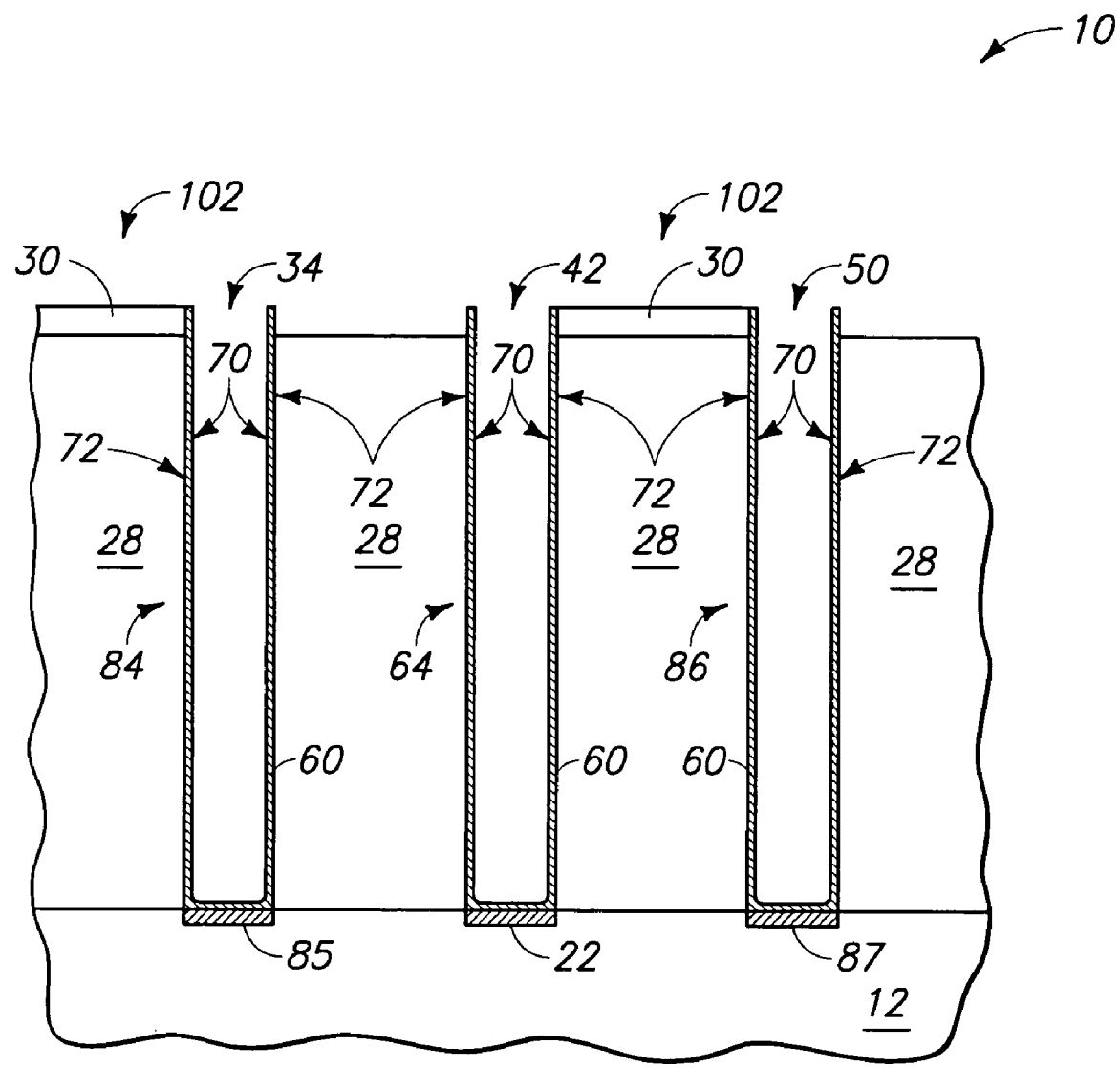
FIG. 12 is a diagrammatic cross-section along the line 12—12 of FIG. 11.

Referring next to FIGS. 10–12, a pattern is transferred from masking material 80 (FIGS. 7–9), to retaining structure 30, and subsequently the masking material is removed.

Removal of structural material 30 exposes portions of the outer surfaces 72 of the containers (for example, containers 62, 64, 66 and 68 of FIG. 10) at uppermost regions of the containers. The material 30 of FIGS. 10–12 has been patterned into a pattern from mask 80 (FIGS. 7–9), and accordingly the material 30 remains continuous over peripheral region 18 and intermediate region 16, and is patterned to comprise rows 102 extending between pairs of capacitor container rows. For instance, the lower row 102 of FIG. 11 connects the horizontal row of capacitor containers containing the containers within openings 40, 42, 44 and 46 with the row of capacitor containers that are within openings 48, 50, 52 and 54. Retaining structure 30 physically contacts the material 60 of the capacitor containers within each row. In particular aspects, the retaining structure 30 can contact all of the container structures associated with an array over memory device region 14, and in other aspects the retaining structure can contact only some of the capacitor devices. It can be preferred, however, that the retaining structure contact all of the devices in order to alleviate (and preferably prevent) toppling and other structural defects from occurring in the devices in subsequent processing (described below).

FIGS. 10 and 12 illustrate structures in which material 30 is removed relative to material 28 with high selectivity so that effectively little or none of material 28 has been removed during the removal of material 30. FIG. 13 illustrates construction 10 at the processing stage of FIG. 12, but in accordance with an aspect in which the selectivity of removal of material 30 relative to material 28 is less than that of FIG. 12. Accordingly, some of material 28 has been removed during the processing to recess portions of material 28 exposed to the etch conditions utilized for removal of material 30 relative to other portions of material 28. In some aspects (not shown), the conditions utilized to remove material 30 can also remove some of conductive material 60.

Figure 16:
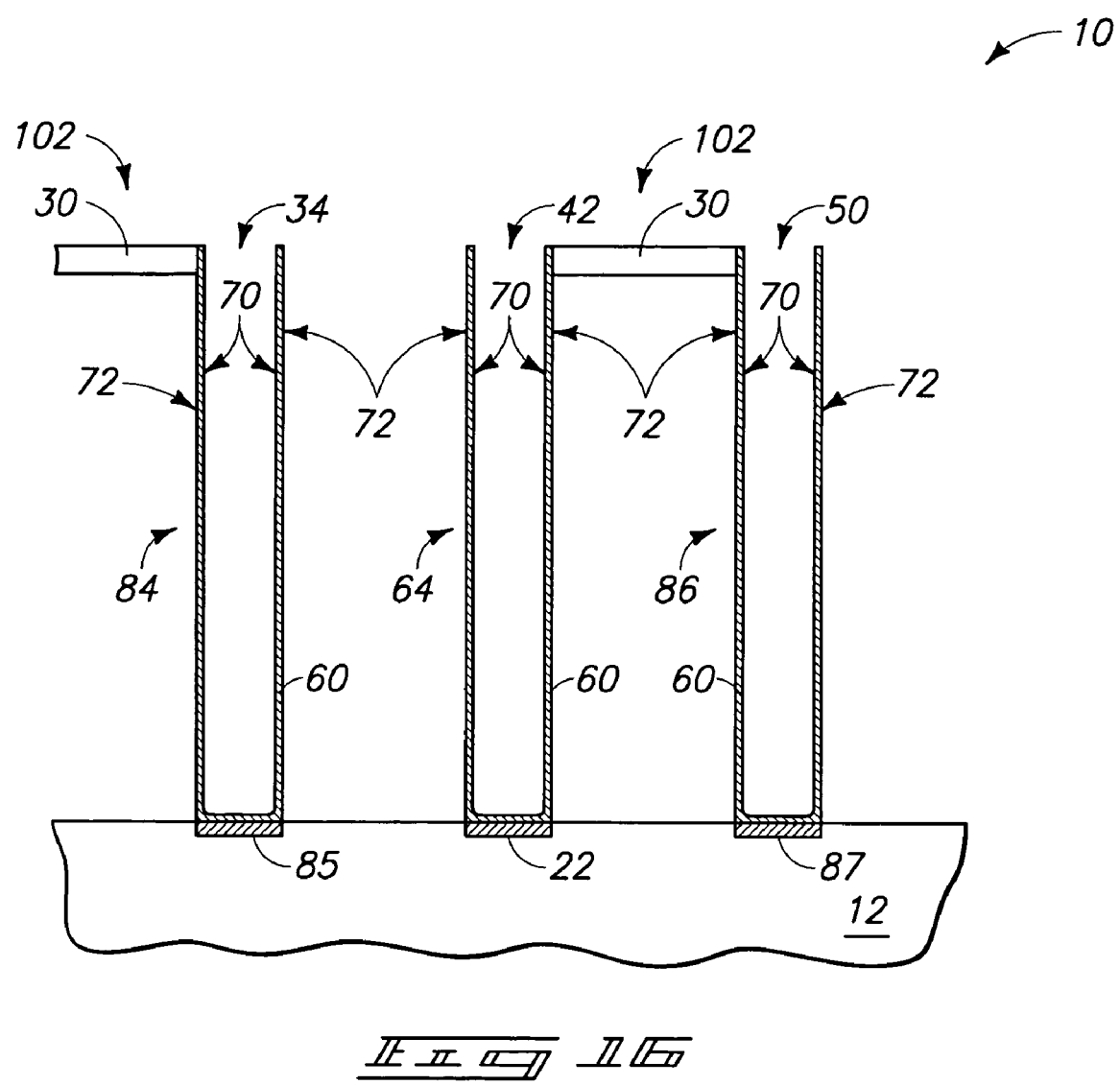
FIG. 16 is a diagrammatic, cross-sectional view along the line 16—16 of FIG. 15.

Referring next to FIGS. 14–16, construction 10 is exposed to conditions which isotropically remove material 28 selectively relative to retaining structure 30. The etching can utilize, for example, a wet etch. For purposes of interpreting this disclosure and the claims that follow, an etch is considered to be selective for a first material relative to a second material if the etch removes the first material at a faster rate than the second material, including, but not limited to, conditions in which the second material is substantially not removed during the removal of the first material (i.e., conditions in which the rate of removal of the second material is essentially 0).

The removal of material 28 exposes outer surfaces 72 of the container structures (such as, for example, the container structures 62, 64, 66 and 68 of FIG. 14). In the shown aspect of the invention, material 28 is substantially entirely removed from over memory region 14, and accordingly an entirety of outer surfaces 72 are exposed. It is to be understood that the invention encompasses other aspects in which only a portion of material 28 is removed by the isotropic etch, and accordingly wherein only portions of the outer surfaces 72 are exposed.

As discussed previously, a material resistant to the etch of material 28 (i.e., an etch stop) can be provided under material 28 in aspects of the invention which are not shown. If the etch stop material is present, such can protect features underlying the etch stop during the isotropic etch of material 28.

Retaining material 30 remains in physical contact with portions of conductive material 60 of the containers formed from material 60, and accordingly supports the containers. Retaining structure can thus alleviate, and even prevent, toppling or other structural defects from occurring within an array of container structures. Structural material 30 can enable container structures having a high aspect ratio to be formed, and to have outer surfaces (72) exposed, while alleviating, and in particular aspects even preventing, toppling of the containers. In the aspect of the invention shown in FIG. 15, retaining material 30 connects alternating pairs of rows of a container structure array.

The conductive material 60 associated with individual containers is shown in FIGS. 14–16 to be in the a shape of an annulus or a ring. It is to be understood, however, that the invention encompasses other aspects in which material 60 is formed in different shapes. Also, as discussed previously, the invention encompasses aspects in which material 60 (alone or in combination with other conductive materials) is in the shape of a pedestal instead of being in the shown shape of a container. The retaining material 30 can provide structural support to the pedestals in such aspects of the invention.

The conductive material 60 within trench 56, together with the material 30 over periphery 18 forms a protective barrier (or shield) so that the isotropic etching of material 28 over memory region 14 does not extend into the material 28 associated with peripheral region 18. Such can alleviate damage to circuitry (not shown) associated with peripheral region 18 that could otherwise occur if an isotropic etch penetrated into the material 28 associated with peripheral region 18. The protective material 60 within trench 56 forms a protective trough (or moat) 71 which protects material 28 of peripheral region 18 from the isotropic etch utilized in removing material 28 from over memory array region 14. In the shown aspect of the invention, the moat is double-sided. In other words, conductive material 60 covers both sides of trench 56. It is to be understood, however, that the invention includes other aspects (not shown) in which the conductive material is only along the side of trench 56 nearest peripheral region 18, and is thus not on the side of trench 56 nearest memory array region 14.

The illustrated double-sided trough (or moat) 71 has a pair of spaced sidewalls 73 and 75. Electrically insulative material 28 has a lateral sidewall 77 at a lateral periphery of region 18, and sidewall 75 of trough 71 is a liner along the lateral 77 of material 28. In the shown aspect of the invention, sidewall 75 is directly against (i.e., physically contacts) the portion of material 30 over region 18. In aspects in which material 28 comprises BPSG and material 30 comprises silicon nitride, the sidewall 75 can be directly against both the BPSG of layer 28 and the silicon nitride of layer 30 that extends over region 18. Conductive material 60 can, for example, comprise, consist essentially of, or consist of titanium nitride. Accordingly, the invention encompasses aspects in which a liner containing titanium and nitrogen is directly against both the material 28 (which can be, for example, BPSG) and the layer 30 (which can be, for example, silicon nitride).

Sidewall 73 of trough 71 has an inner surface facing first sidewall 75 and an opposing outer surface facing memory array region 14. A portion of material 30 is shown directly against the outer surface and extending over memory array region 14. The portion of material 30 extending over memory array region 14 comprises the segments (or rows) 102 which connect adjacent rows of capacitor container structures to one another.

The trough 71 of material 60 forms a shield which protects a lateral periphery of material 28 over region 18 from the isotropic etching conditions utilized to remove material 28 from over memory array region 14. In particular aspects of the invention, the trough 71 formed by conductive material 60 is electrically isolated from any circuitry associated with construction 10.

A portion of retaining structure 30 is shown jutting from a surface of the conductive material 60 within trench 56 (such portion is labeled as 95 in FIG. 14). In particular aspects, the portion 95 can be eliminated. However, there can be advantages to providing portion 95 along the edge of the conductive material 60 associated with trench 56, in that such can provide structural integrity to the material 60 within trench 56.

Figure 17:
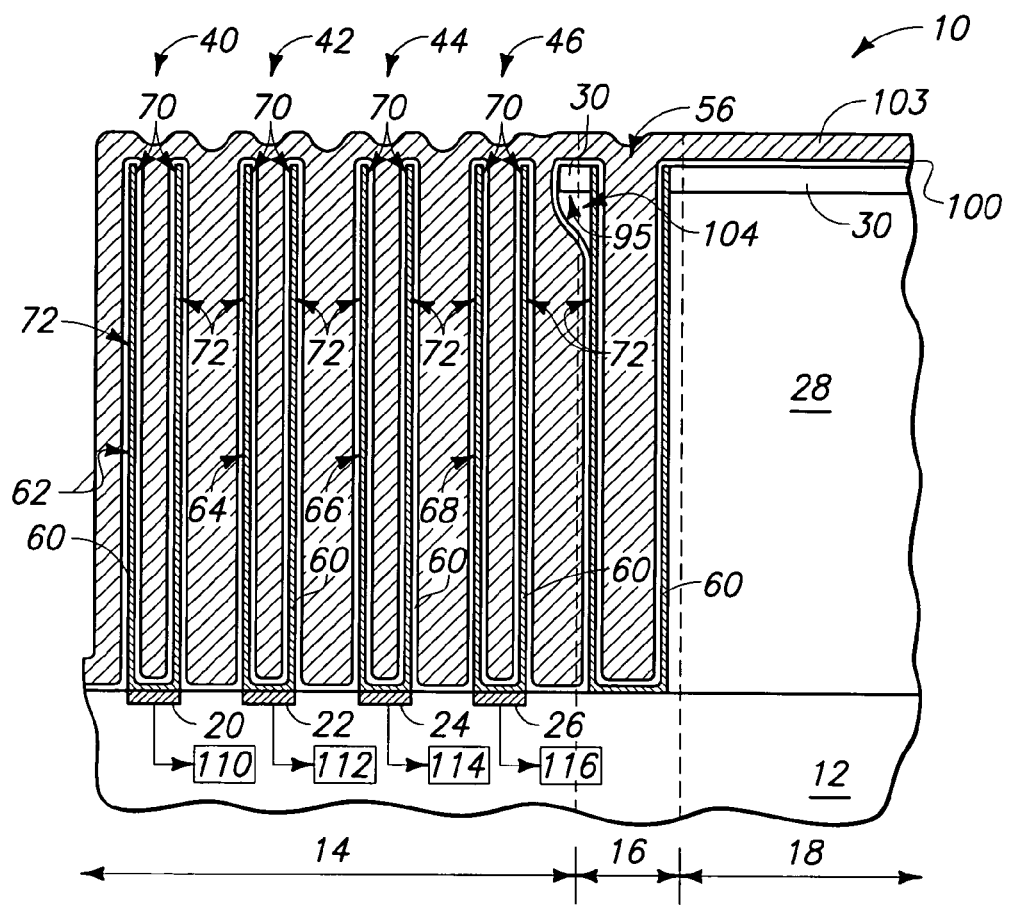
FIG. 17 is a view of the FIG. 1 cross-section shown at a processing stage subsequent to that of FIG. 14.
Figure 18:
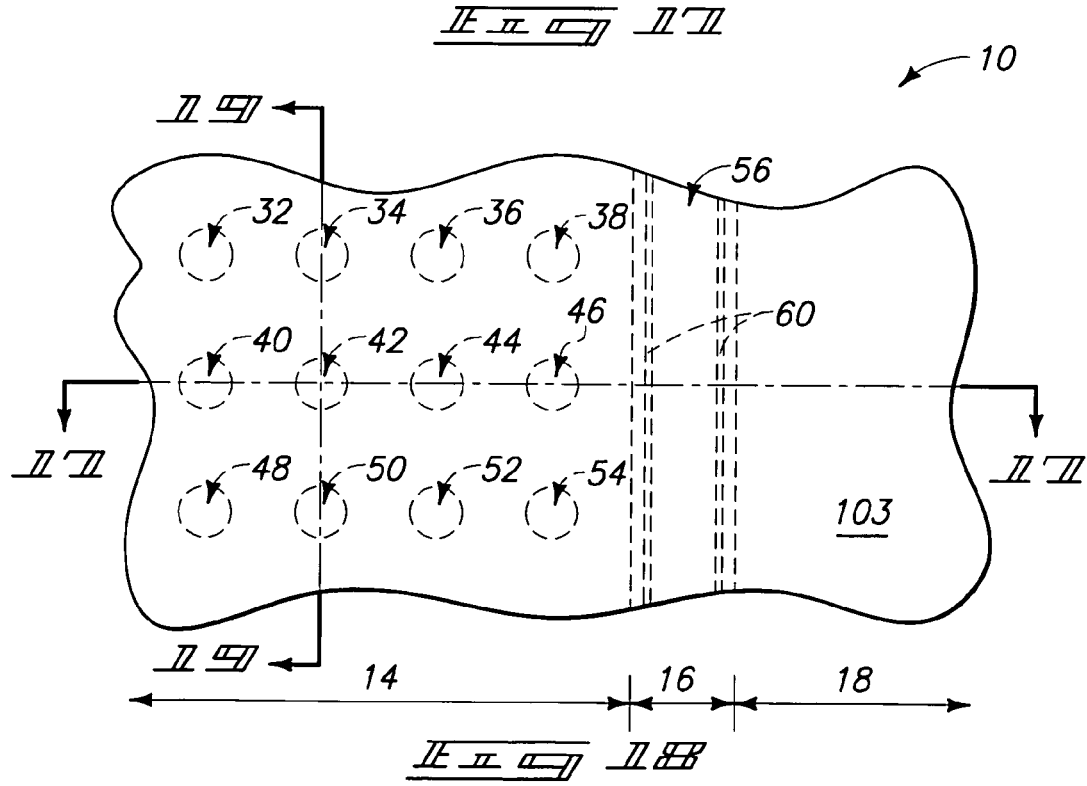
FIG. 18 is a diagrammatic top view of a semiconductor wafer fragment comprising the cross-section of FIG. 17 along the line 17—17.
Figure 19:
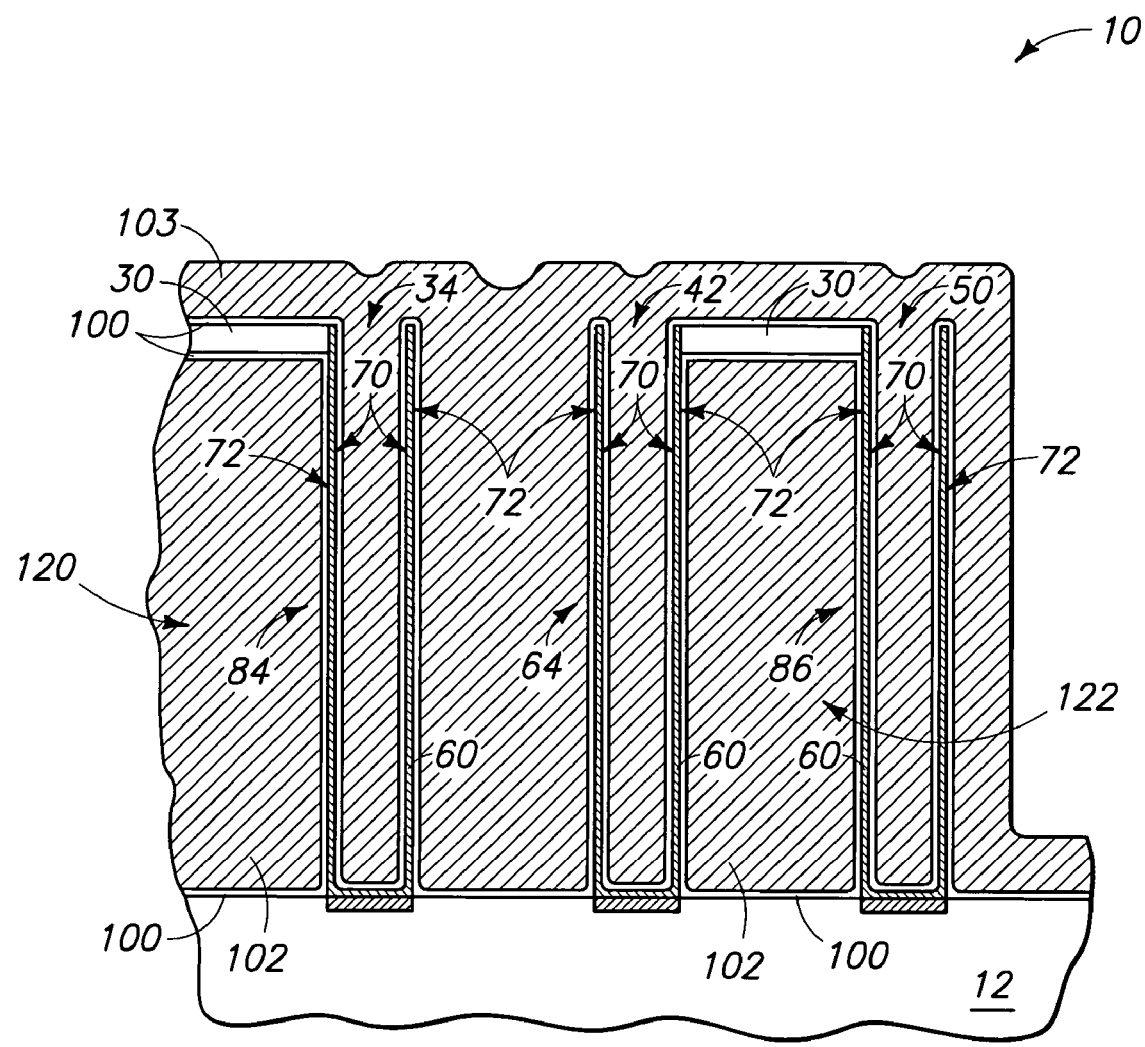
FIG. 19 is a diagrammatic, cross-sectional view along the line 19—19 of FIG. 18.

Referring next to FIGS. 17–19, a dielectric material 100 and a conductive material 103 are formed within openings 32, 34, 36, 38, 40, 42, 44, 46, 48, 50, 52 and 54, as well as along outer sidewall edges 72 of the container structures. Conductive material 60 of the capacitor container structures can be referred to as a first capacitor electrode, and conductive material 103 can be referred to as a second capacitor electrode. The capacitor electrodes 60 and 103, together with dielectric material 100, form an array of capacitor structures within the array of openings 32, 34, 36, 38, 40, 42, 44, 46, 48, 50, 52 and 54. The openings, together with trench 56, are shown in phantom view in FIG. 18 to indicate that such are below conductive material 103 in the shown view. Although the shown capacitors are container capacitors, it is to be understood that the capacitors can also be pedestal capacitors (i.e., can comprise the dielectric material 100 and the conductive material 103 extending around pedestals of material 60) in accordance with various aspects of the invention discussed above.

It can be preferred that retaining structure 30 consist of electrically insulative materials so that the retaining structure can remain in construction 10 (as shown in FIGS. 17–19), without shorting between capacitor container structures in physical contact with retaining structure 30. However, it is to be understood that the invention can encompass other aspects (not shown) in which structure 30 is removed after formation of one or both of dielectric material 100 and second capacitor electrode 102; and in such aspects retaining structure 30 can comprise electrically conductive materials in addition to, or alternatively to, electrically insulative materials. Retaining structure can be removed after formation of one or both of dielectric material 100 and second capacitor electrode 102 since the dielectric material and second capacitor electrode can each provide structural stability to the container structures (such as, for example, structures 62, 64, 66 and 68 of FIG. 14), so that the container structures can be supported without retaining structure 30. In aspects in which retaining structure 30 is to be removed, such can be accomplished utilizing, for example, photolithographic patterning to form a mask (not shown), followed by an appropriate etch, or etches, to penetrate any materials over retaining structure 30 and subsequently remove retaining structure 30.

In the shown aspect of the invention, a gap 104 is illustrated beneath the portion of retaining structure 30 jutting outwardly from the protective material 60 within trench 56. It is to be understood that gap 104 can, in particular aspects, be filled through appropriate deposition of one or both of dielectric material 100 and conductive material 102. The gap 104 is provided to show one aspect of the invention. Conditions can typically be chosen under which dielectric material 100 and conductive material 102 deposit well on the underside of supporting layer 30, and accordingly there would be no gap 104.

Transistor structures 110, 112, 114 and 116 are diagrammatically illustrated in FIG. 17. The transistor structures would have source/drain regions either encompassing node locations 20, 22, 24 and 26, or ohmically connected with node locations 20, 22, 24 and 26. The transistor devices and capacitor constructions formed in accordance with methodology of the present invention can be together incorporated into an array of DRAM cells.

FIG. 19 shows regions 120 and 122 beneath the retaining structure 30 filled with materials 100 and 102.

In the processing described above with reference to FIGS. 1–19, a single homogeneous retaining structure (30) was shown over an upper surface of mass 28. As discussed previously the invention encompasses other aspects in which more than one retaining structure (or alternatively considered, a retaining structure comprising more than one layer) is utilized. The invention also comprises aspects in which a retaining structure is provided at an elevational location other than the top surface of mass 28.

Figure 20:
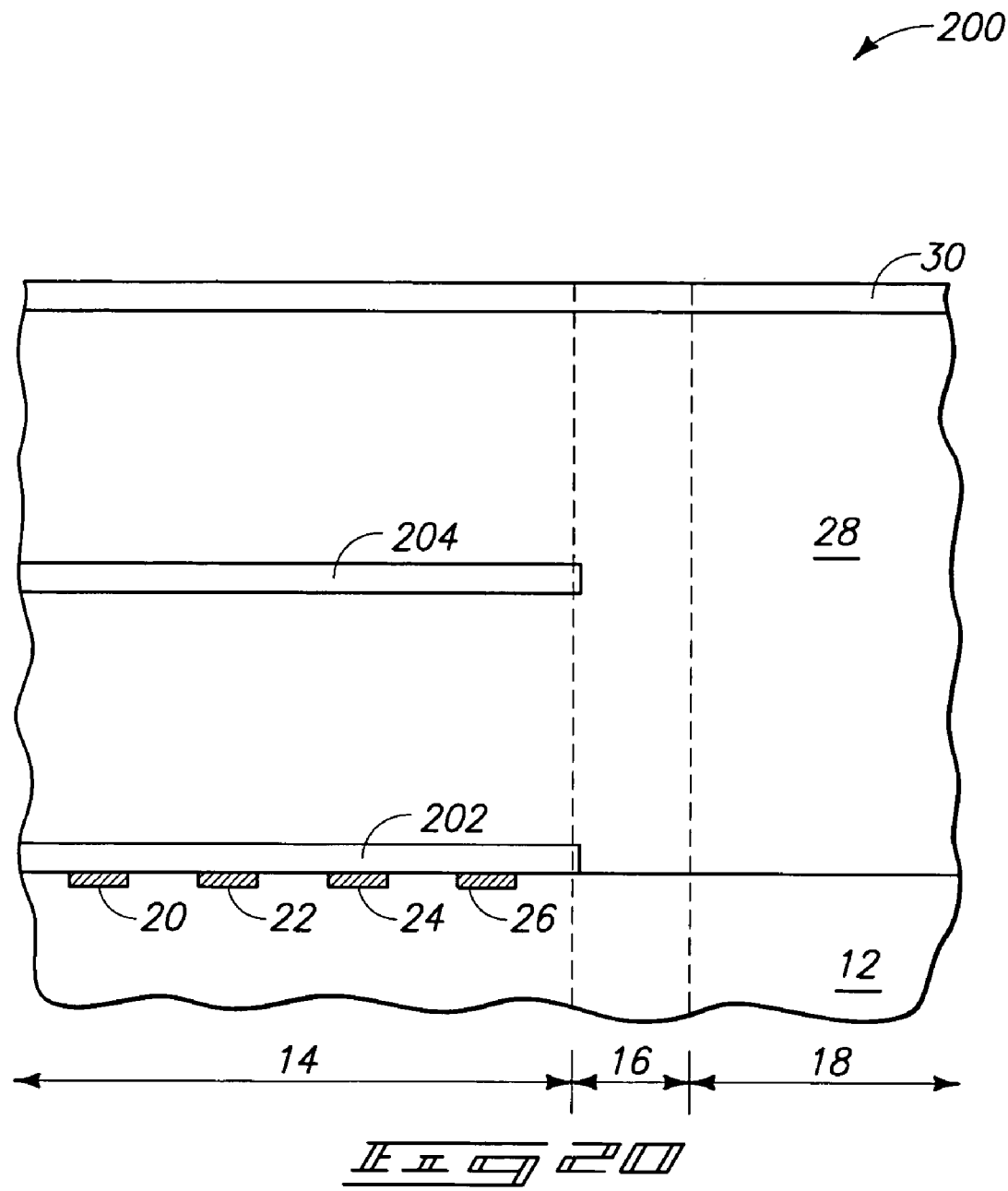
FIG. 20 is a diagrammatic, cross-sectional view of a semiconductor wafer fragment at an exemplary processing stage of an aspect of the present invention alternative to that of FIG. 1.
Figure 22:
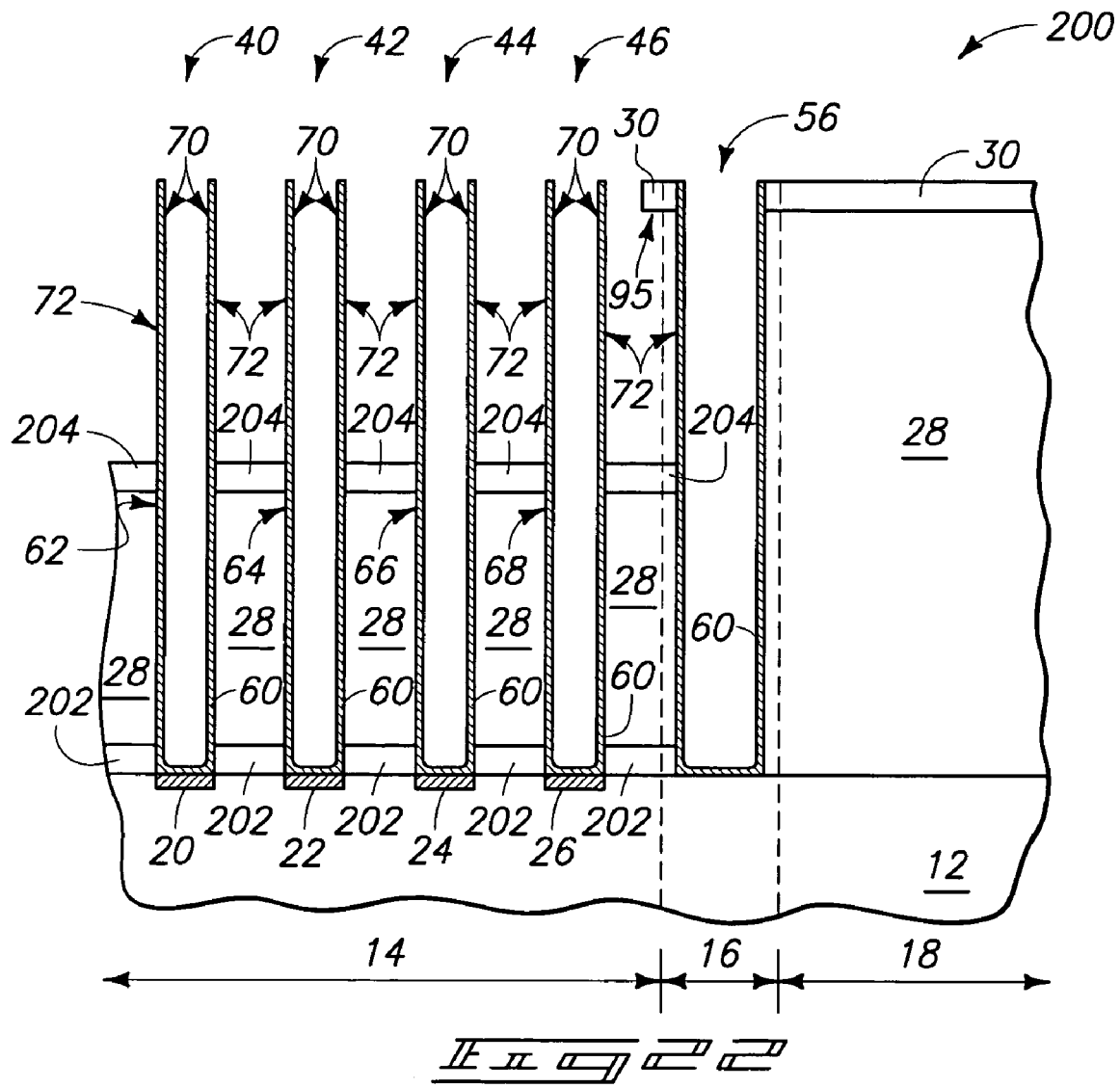
FIG. 22 is a view of the FIG. 20 cross-section shown at a processing stage subsequent to that of FIG. 21.

FIGS. 20–22 illustrate processing in which three retaining structures are utilized at different elevational locations within mass 28. In referring to FIGS. 20–22 similar numbering will be utilized as was used above in describing FIGS. 1–19, where appropriate.

Referring initially to FIG. 20, a construction 200 similar to the construction 10 of FIG. 1 is illustrated. Construction 200 comprises substrate 12 and node locations 20, 22, 24 and 26. Construction 200 also comprises insulative mass 28 and retaining structure 30 over mass 28. Construction 200 differs from the construction of FIG. 1 in that construction 200 further comprises a second retaining structure 202 over an upper surface of substrate 12 and beneath mass 28; and a third retaining structure 204 elevationally located within the thickness of mass 28. Retaining structures 202 and 204 are shown to extend over memory array region 14 of construction 200, but not over peripheral region 18 of the construction (although in other aspects, not shown, one or both of retaining structures 202 and 204 can also extend over peripheral region 18). Structures 202 and 204 can comprise compositions similar to those previously described for structure 30. Accordingly, structures 202 and 204 can consist essentially of, or consist of silicon nitride. Alternatively, structures 202 and 204 can comprise, consist essentially of, or consist of a silicon nitride layer together with one or more layers consisting essentially of, or consisting of materials other than silicon nitride. The layers other than silicon nitride can include, for example, dielectric materials, such as, for example, aluminum oxide.

Referring to FIG. 21, construction 200 is illustrated at a processing stage analogous to that previously described with reference to FIG. 3. Openings 40, 42, 44 and 46 extend through mass 28, as well as through retaining structures 202, 204 and 30. Additionally, trench 56 extends through retaining structure 30 and mass 28. The shown aspect is but one aspect of the invention, and in other aspects, structures 202 and 204 can be outside of trench 56 so that a periphery of the trench does not extend to the structures.

Referring to FIG. 22, construction 200 is shown at a processing stage analogous to that described previously with reference to FIG. 14. Specifically, retaining structure 30 has been patterned and subsequently material 28 has been exposed to an isotropic etch which is selective for material 28 relative to the material of retaining structures 30 and 204. Retaining structure 204 protects the material 28 thereunder from exposure to the etch, and accordingly the etch effectively stops at retaining structure 204.

The construction 200 of FIG. 22 comprises container-shaped capacitor electrodes 62, 64, 66 and 68 similar to the electrodes of FIG. 14 (and in other processing, not shown, could comprise pedestal-shaped capacitor electrodes). In contrast to the electrodes of FIG. 14, the electrodes of FIG. 22 only have portions of their outer sidewall surfaces (72) exposed, rather than having an entirety of the outer sidewall surfaces exposed. The retaining structure 204 can thus provide additional structural integrity to the container structures 62, 64, 66 and 68 beyond that provided by retaining structure 30 alone.

The processing described above with reference to FIGS. 1–22 forms the retaining structures (30, 202 and 204) entirely across surfaces of regions 14, 16 and 18 and then extends the capacitor container openings (for example, 40, 42, 44 and 46) through both the retaining structures and the mass 28. It is to be understood that the invention encompasses other aspects in which one or more retaining structures are patterned prior to formation of the capacitor container openings. Such aspect is described with reference to FIGS. 23 and 24. In referring to FIGS. 23 and 24, similar numbering will be used as was utilized above in describing FIGS. 1–22, where appropriate.

Figure 23:
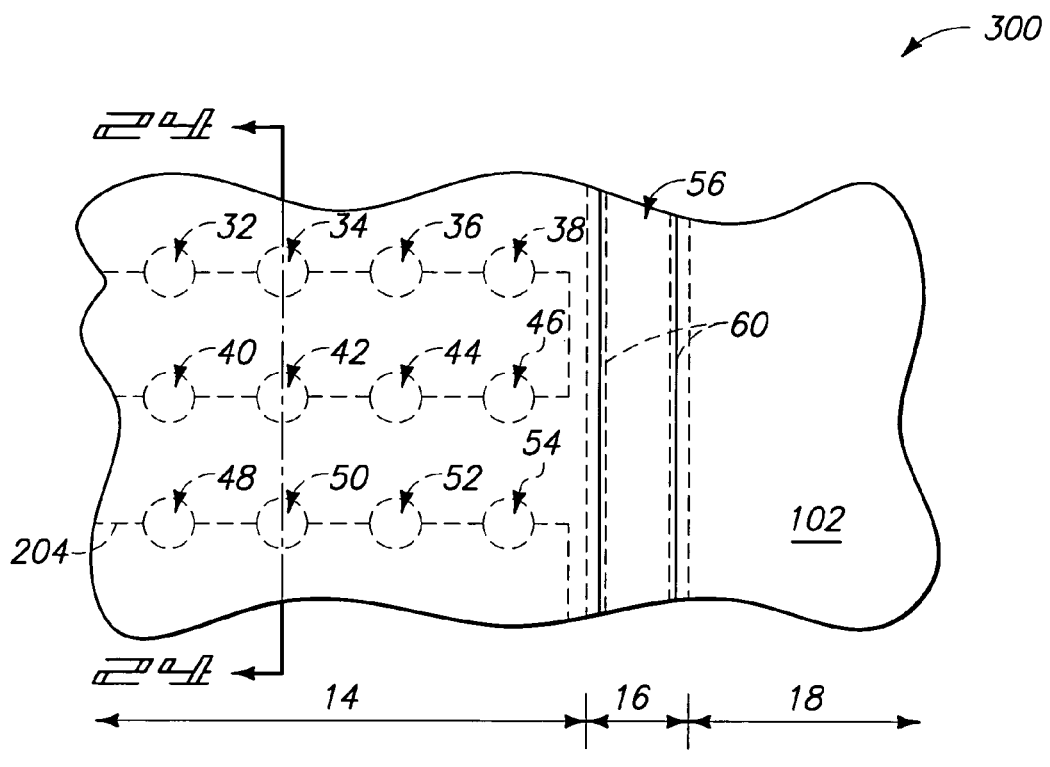
FIG. 23 is a diagrammatic, top view of a semiconductor wafer fragment shown at a preliminary processing stage in accordance with a third aspect of the present invention.
Figure 24:
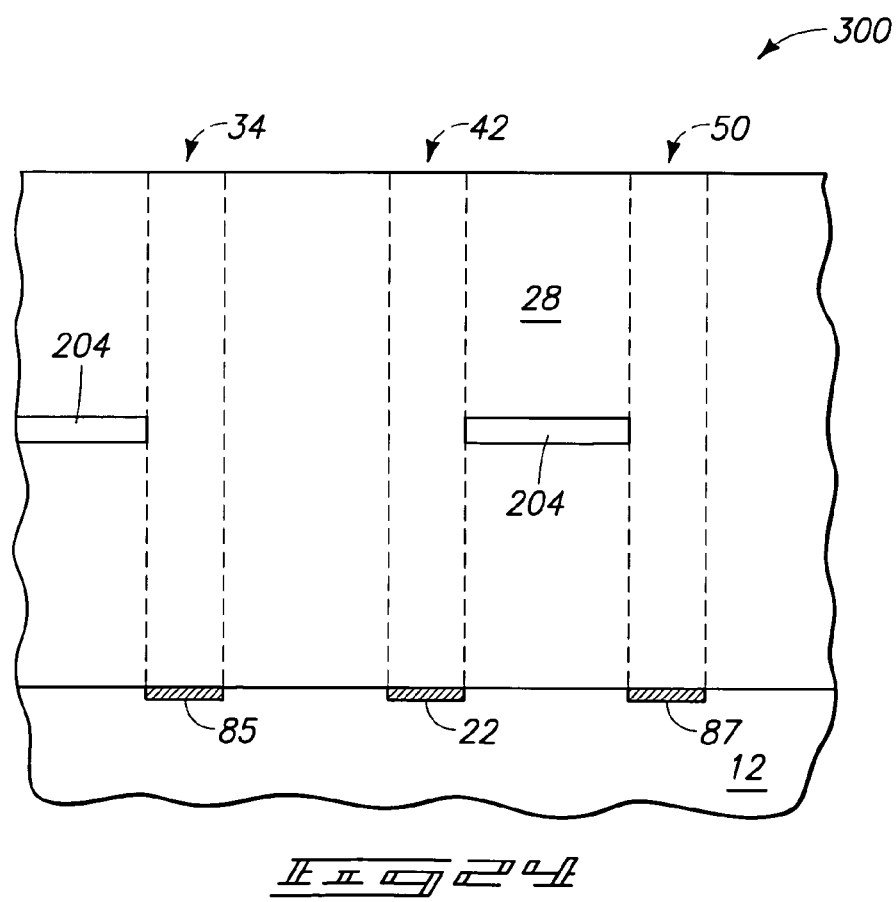
FIG. 24 is a view along the cross-section 24—24 of FIG. 23.

FIGS. 23 and 24 illustrate a construction 300 at a processing stage analogous to that of FIG. 1. Structure 300 is shown in a top view in FIG. 23, with such top view being analogous to the top view of FIG. 2, but showing phantom locations where openings 32, 34, 36, 38, 40, 42, 44, 46, 48, 50, 52 and 54 will ultimately be formed. FIG. 24 shows a cross section of FIG. 23 along the line 24—24, with such cross section being analogous to the cross section of FIG. 9, but being at a processing stage earlier than that of FIG. 9. Construction 300 comprises the retaining structure 204 described previously with reference to FIGS. 20–22, but does not contain the retaining structure 30 described previously with reference to FIGS. 1–22, nor does it contain the retaining structure 202 described with reference to FIGS. 20–22. Locations where openings 34, 42 and 50 (the openings as shown in, for example, FIG. 4) are illustrated in phantom in FIG. 24 to indicate where the openings will be formed, and to indicate that the openings are not yet formed at the processing stage of FIG. 24. Retaining structure 204 is shown patterned so that the locations of openings 34, 42 and 50 extend to structure 204. The location of patterned structure 204 is shown in phantom view in FIG. 23, where it can be seen that the retaining structure has a pattern comparable to that adopted by patterned structure 30 in FIG. 11. Accordingly, retaining structure 204 extends to locations where capacitor container openings will ultimately be formed. In subsequent processing, the container openings can be formed through mass 28, and can be formed to have a periphery comprising retaining structure 204.

The construction of FIGS. 23 and 24 can be formed by initially forming a first portion of material 28, and then forming the patterned retaining structure 204 over the first portion of material 28. Subsequently, a second portion of material 28 can be formed over the patterned retaining structure. Since the retaining structure was patterned prior to forming the second portion of material 28, some of the second portion of material 28 is formed directly against the retaining structure 204 (specifically, the portion of material 28 formed over structure 204), and some of the second portion of material 28 is formed directly against the first portion of material 28 that had been formed prior to the formation and patterning of retaining structure 204 (specifically, the portion of material 28 formed within the regions where openings 34, 42 and 50 will ultimately be formed).

It is mentioned in describing FIGS. 1–24 that retaining structures (such as, for example, structures 30, 202 and 204) can comprise single layers, or multiple layers. FIGS. 25–28 illustrate exemplary aspects of the invention in which retaining structure (or lattice) 30 comprises multiple layers of material. In referring to FIGS. 25–28, similar numbering will be used as was utilized above in describing FIGS. 1–24, where appropriate.

Figure 25:
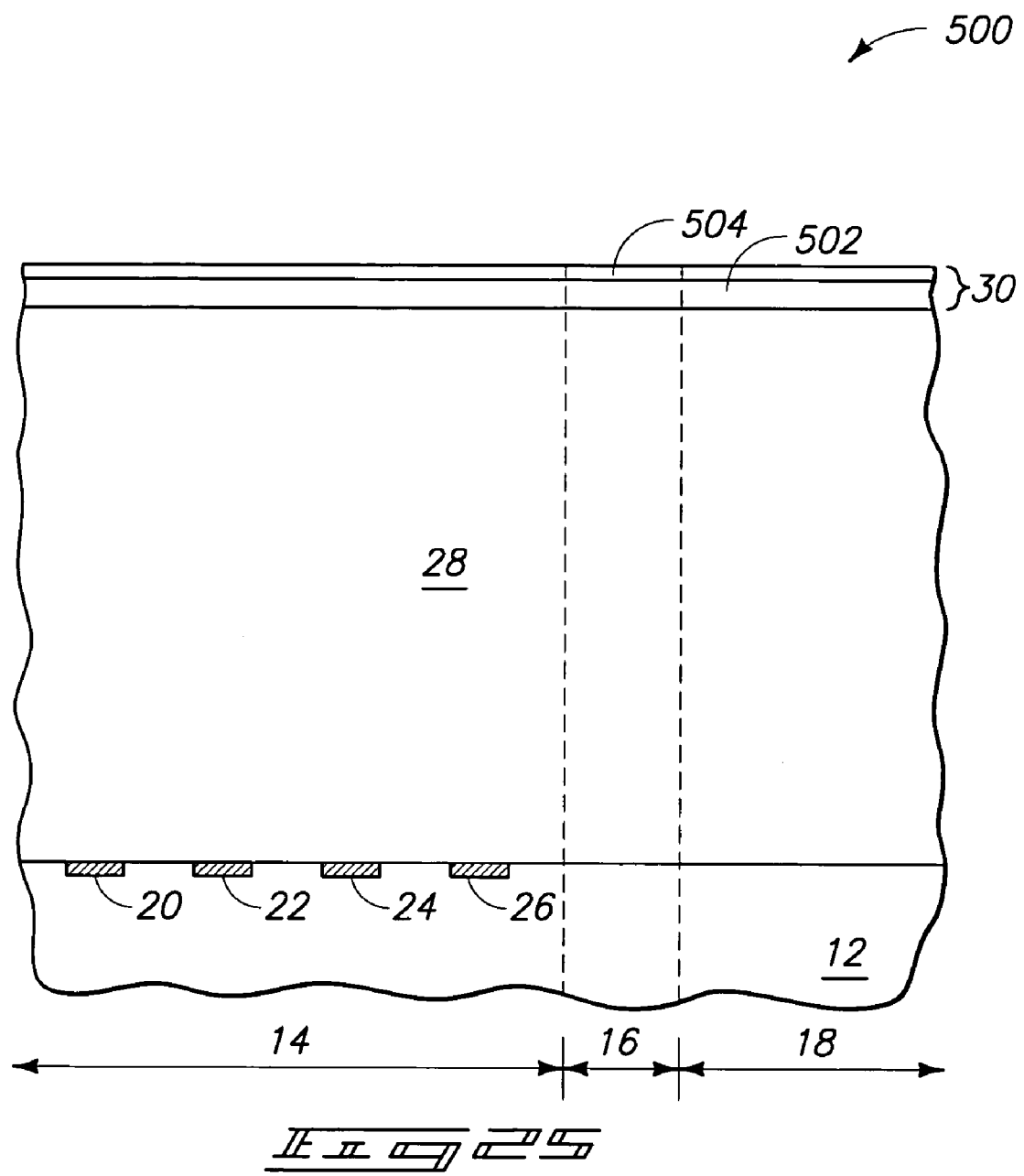
FIG. 25 is a diagrammatic, cross-sectional view of a semiconductor wafer fragment shown at a preliminary processing stage of a fourth aspect of the present invention.

Referring to FIG. 25, a construction 500 is illustrated at the processing step described previously with reference to FIG. 1. Construction 500 is similar to the construction 10 described in FIG. 1, except that the material 30 of FIG. 25 is illustrated comprising two separate layers 502 and 504. One of layers 502 and 504 can, in particular aspects of the invention, comprise, consist essentially of, or consist of silicon nitride. The other of layers 502 and 504 can, in particular aspects of the invention, comprise, consist essentially of, or consist of silicon, and can be in the form of, for example, amorphous silicon and/or polycrystalline silicon.

As discussed above with reference to FIG. 14, one aspect of the invention is a selective etch for material 28 relative to retaining structure 30. In particular aspects, it can be desired to have a thin layer of silicon nitride be the predominate material of layer 30, in that silicon nitride is an electrically insulative material which is relatively cheap and easy to deposit and pattern. A problem in utilizing silicon nitride can be that it is difficult to etch materials commonly utilized for mass 28 relative to silicon nitride. For instance, if mass 28 comprises borophosphosilicate glass, it can be difficult to selectively etch the borophosphosilicate glass relative to silicon nitride to the extent desired in various applications. Specifically, the silicon nitride is preferably very thin, and yet mass 28 is very thick, so if the selectivity for the material of mass 28 is not extremely high, the silicon nitride will be etched by the time that the entirety of mass 28 is etched. Accordingly, it can be advantageous to utilize a component of structure 30 for which the etch of material 28 has enhanced selectivity relative to the selectivity of the etch toward silicon nitride. Suitable materials can be materials consisting essentially of, or consisting of silicon. If the silicon remains undoped, such can effectively be an insulative material, and accordingly can have advantages similar to those of silicon nitride. The silicon can be in any form, including, polycrystalline, either smooth grain or hemispherical grain, and/or amorphous. A polysilicon layer can be more resistant than silicon nitride to the chemistries typically utilized during the etching back of glasses (such as, for example, the 25:1 HF chemistry utilized to etch borophosphosilicate glass).

In embodiments in which one of the layers 502 and 504 consists essentially of, or consists of silicon nitride, and the other of layers 502 and 504 consists essentially of, or consists of silicon, the silicon can be either the top layer or the bottom layer. Silicon on the top can be removed by subsequent container chemical-mechanical polishing (CMP).

Figure 26:
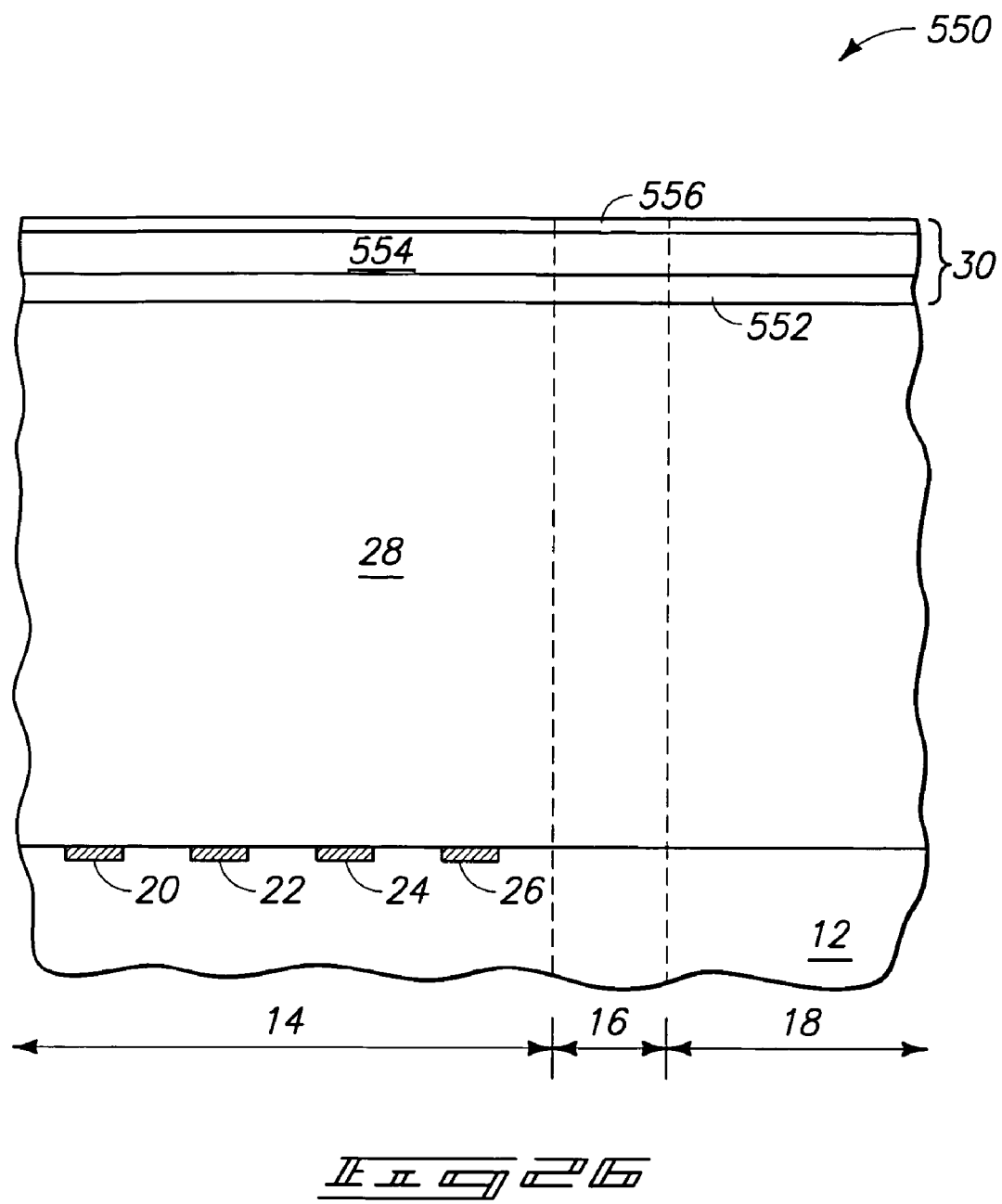
FIG. 26 is a diagrammatic, cross-sectional view of a semiconductor wafer fragment shown at a preliminary processing stage in accordance with a fifth aspect of the present invention.

FIG. 26 shows a structure 550 illustrating an alternative aspect of the present invention. Structure 550 is shown at a processing stage analogous to that of structure 500 in FIG. 25. Structure 550 is similar to the structure 500 of FIG. 25, except that the retaining structure 30 of construction 550 comprises three layers, instead of the two of structure 500. The three layers of the retaining structure of construction 550 are labeled 552, 554 and 556, respectively. In particular embodiments, layers 552 and 556 (the outer layers of the retaining structure stack 30) can comprise, consist essentially of, or consist of silicon; and layer 554 (the inner material of the retaining structure stack 30) can consist essentially of, or consist of silicon nitride. Accordingly, the silicon layers 552 and 556 can provide protection on both sides of nitride material 554.

Referring next to FIG. 27, such shows a construction 600 at a processing stage similar to that described previously with reference to FIG. 10. The construction differs from that of FIG. 10 in that retaining structure 30 comprises a pair of materials 604 and 606. Materials 604 and 606 can be similar to the materials 502 and 504 described with reference to FIG. 25. In particular aspects, material 604 can consist essentially of silicon nitride or consist of silicon nitride, and material 606 can consist essentially of silicon or consist of silicon. After the etching of material 30 over memory array region 14 (described above with reference to FIG. 10) a spacer 610 is provided over an exposed sidewall of the material 604. Spacer 610 can be formed by, for example, forming a layer of appropriate material and subsequently anisotropically etching the layer. Spacer 610 can comprise the same composition as layer 606, and accordingly can consist essentially of, or consist of silicon. The utilization of layers 610 and 606 provides protection to exposed sidewalls of material 604 as well as to an upper surface of the material during a subsequent etch of material 28 (such as, for example, the etch described previously with reference to FIG. 14).

FIG. 28 shows an expanded view of the region 28 of structure 600 in accordance with an alternative aspect of the invention relative to that shown in FIG. 27. Specifically, the expanded region comprises structure 30, and shows the structure to comprise a layer 612 in addition to the layers 604 and 606. Layer 612 is under layer 604, and in particular aspects layer 612 can consist essentially of, or consist of silicon. Accordingly, the stack comprising layers 612, 604 and 606 can be a layer consisting of silicon (612), a layer consisting of silicon nitride (604), and a layer consisting of silicon (606) over the silicon nitride. Further, the sidewall spacer 610 is shown formed along an exposed sidewall of the stack containing layers 612, 604 and 606. As discussed above, the composition of 610 can consist essentially of or consist of silicon. Accordingly, in particular aspects of the invention, layer 604 can comprise silicon nitride, and such layer can be entirely surrounded by layers consisting essentially of, or consisting of silicon (the shown layer 606, 610 and 612). Although layers 606, 610 and 612 can comprise the same composition as one another, it is to be understood that the invention also encompasses aspects in which layers 606, 610 and 612 comprise different compositions relative to one another.

In aspects in which layer 610 comprises silicon, it is to be understood that the silicon utilized to form the layer can extend into the container openings associated with memory region 14 (such as, for example, the container openings for 40, 42 44 and 46 of FIG. 27). In particular aspects, the silicon can subsequently be removed from within the container openings by an appropriate etch. In other aspects, the silicon can be left within the container openings, conductively doped, and incorporated into a capacitor electrode.

The surrounding of a silicon nitride material 604 with materials more resistant to an etch than silicon nitride (materials 606, 610 and 612 of FIG. 28) can be advantageous. The etch utilized to remove material 28 (such as the etch described above with reference to FIG. 14) is typically an isotropic etch. Accordingly portions of silicon nitride material 604 would ultimately be exposed to the etch unless the portions are covered by a protective material, regardless of whether the portions are on the top, bottom or side of the silicon nitride material.

The utilization of polysilicon and/or amorphous silicon within material 30 can enable the material to function as a hard mask during formation of the container openings and trench at the processing stage of FIGS. 3 and 4. The trench can have a different critical dimension and/or other patterning aspects than the container openings. Utilization of a hard mask without overlying photoresist can be advantageous in forming the different patterning aspects and/or critical dimension of the trench and container openings. Specifically, the hard mask can allow for more consistent etch rates between the trench and the container openings than would occur with a photoresist mask. As discussed in more detail below, the trench can extend entirely around memory array circuitry. If the trench is etched too deeply and/or widely, the etch can penetrate into the peripheral circuitry and cause damage to various circuit devices, such as, for example, digit lines. Frequently a silicon nitride etch stop will be provided over the peripheral circuitry, but the etch to form the trench may even penetrate through an etch stop if it is overly enhanced relative to etching utilized to form container openings.

Figure 29:
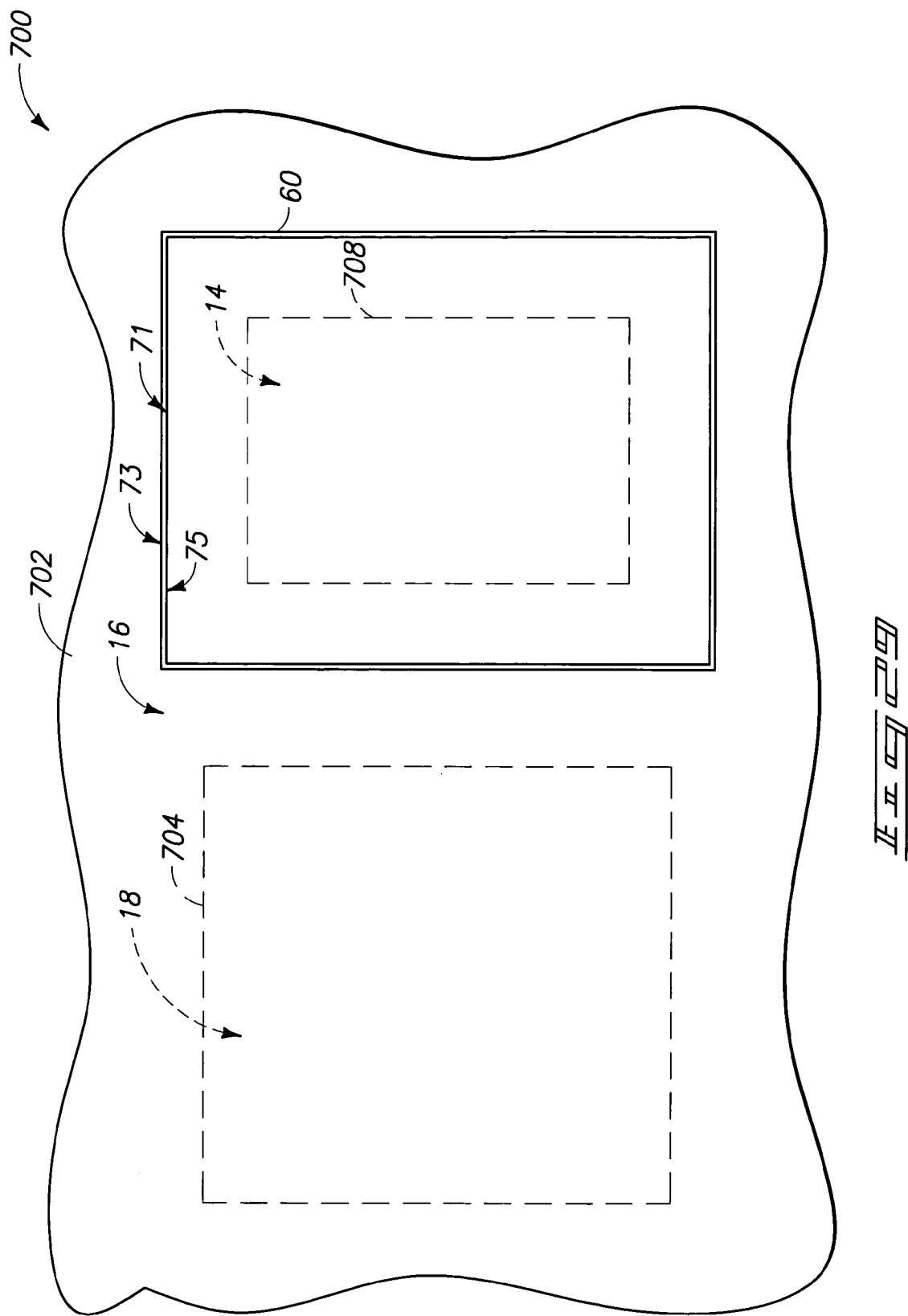
FIG. 29 is a diagrammatic top view of a fragment of a semiconductor construction illustrating an exemplary liner formed in accordance with an aspect of the present invention.

The trough 71 described with reference to FIGS. 14–17 can be advantageously utilized to entirely surround a region of a semiconductor construction. In the aspects of the invention described above, the trough is created by forming an electrically conductive material in trough-shaped configuration between a memory array region and a peripheral region (see, for example, FIGS. 14 and 15 where the trough 71 is described as being formed from conductive material 60 over the region 16 between memory array region 14 and peripheral region 18). FIGS. 29 and 30 illustrate exemplary configurations in with the trough is formed to protect a lateral periphery of a peripheral region from the isotropic etch utilized to remove material from region 14 (an exemplary isotropic etch is described above with reference to FIGS. 14–16). Specifically, FIG. 29 shows a top view of an exemplary construction 700 comprising a substrate having a memory array region 14 (diagrammatically illustrated as a box bounded by dashed line 708), a region 18 peripheral to the memory array where logic or other circuitry can be formed (diagrammatically illustrated as a box bounded by dashed line 704), and a region 16 between the memory array region 14 and the peripheral region 18. The memory array region has a lateral periphery defined to entirely laterally surround the memory array region, with such lateral periphery corresponding to dashed line 708, and the peripheral region has a similar lateral periphery defined by dashed line 704. Trough 71 of conductive material 60 is shown laterally surrounding an entirety of the lateral periphery of memory array region 14, and thus the liner 75 defined by a sidewall of the trough entirely laterally surrounds the memory array region 14. FIG. 30 shows a top view of the construction 700 illustrating that the trough 71 of conductive material 60 can extend entirely around the lateral periphery of the peripheral region as well as extending entirely around the lateral periphery of the memory array region.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitor devices, comprising:
   providing a construction comprising a first material over a substrate;
   forming a retaining structure over at least a portion of the first material;
   forming openings extending into the first material;
   forming conductive structures within the openings utilizing a first conductive layer, the conductive structures having outer sidewalls along the first material;
   removing at least some of the first material to expose at least portions of the outer sidewalls of the conductive structures, the retaining structure retaining the conductive structures during the removal of the first material;
   forming a capacitor dielectric material along the exposed portions of the outer sidewalls;
   forming a second conductive layer over the capacitor dielectric material;
   wherein the retaining structure is formed before forming the openings; and
   wherein the openings extend through the retaining structure.

2. The method of claim 1 wherein the conductive structures are container structures having openings extending therein, and wherein the dielectric material and second conductive layer are formed to extend within the openings that extend into the container structures.

3. The method of claim 1 wherein the conductive structures are pedestals.

4. The method of claim 1 wherein the openings extend in an array comprising rows and columns; wherein the conductive structures are formed in the array defined by the openings and thus the conductive structures are within an array comprising rows and columns; and wherein the retaining structure is patterned to extend between and connect alternating pairs of the rows of the conductive structure array.

5. The method of claim 1 wherein the retaining structure is a second retaining structure; and wherein a first retaining structure is formed prior to forming at least some of the first material.

6. The method of claim 5 wherein a first portion of the first material is formed prior to forming the first retaining structure and a second portion of the first material is formed after forming the first retaining structure; and wherein the first retaining structure is patterned prior to forming the second portion of the first material so that some of the second portion of the first material is formed directly against the first retaining structure and some of the second portion of the first material is formed directly against the first portion of the first material.

7. The method of claim 1 wherein the retaining structure is a second retaining structure; wherein a first retaining structure is formed prior to forming the first material; and wherein the first material is between the first and second retaining structures.

8. A method of forming a plurality of capacitor devices, comprising:
   providing a construction comprising a first material over a substrate;
   forming a retaining structure over at least a portion of the first material;
   forming openings extending into the first material;
   forming conductive structures within the openings utilizing a first conductive layer, the conductive structures having outer sidewalls alone the first material;
   removing at least some of the first material to expose at least portions of the outer sidewalls of the conductive structures, the retaining structure retaining the conductive structures during the removal of the first material;
   forming a capacitor dielectric material along the exposed portions of the outer sidewall;
   forming a second conductive layer over the capacitor dielectric material; and
   wherein;
      the first material comprises borophosphosilicate glass;
      an isotropic etch is utilized to remove at least some of the first material; and
      the retaining structure comprises silicon nitride and a material having increased selectivity to borophosphosilicate glass than silicon nitride during the isotropic etch.

9. The method of claim 8 wherein the material having increased selectivity to borophosphosilicate glass than silicon nitride during the isotropic etch consists essentially of silicon.

10. The method of claim 8 wherein the material having increased selectivity to borophosphosilicate glass than silicon nitride during the isotropic etch includes polycrystalline silicon.

11. The method of claim 10 wherein the polycrystalline silicon is over the silicon nitride.

12. The method of claim 10 wherein the polycrystalline silicon is under the silicon nitride.

13. The method of claim 10 wherein the polycrystalline silicon is over and under the silicon nitride.

14. The method of claim 10 wherein the polycrystalline silicon entirely surrounds the silicon nitride.

15. The method of claim 10 further comprising removing the retaining structure from over the first material after forming the second conductive layer.

* * * * *

UNITED STATES PATENT AND TRADEMARK OFFICE
CERTIFICATE OF CORRECTION

| | | |
|---|---|---|
| PATENT NO. | : 7,271,051 B2 | Page 1 of 1 |
| APPLICATION NO. | : 11/272232 | |
| DATED | : September 18, 2007 | |
| INVENTOR(S) | : Manning et al. | |

It is certified that error appears in the above-identified patent and that said Letters Patent is hereby corrected as shown below:

In column 18, line 40, in Claim 8, delete "alone" and insert -- along --, therefor.

In column 18, line 46, in Claim 8, delete "sidewall;" and insert -- sidewalls; --, therefor.

In column 18, line 49, in Claim 8, delete "wherein;" and insert -- wherein: --, therefor.

Signed and Sealed this

Twenty-seventh Day of November, 2007

JON W. DUDAS
*Director of the United States Patent and Trademark Office*